US010290191B2

(12) United States Patent
Peterson et al.

(10) Patent No.: US 10,290,191 B2
(45) Date of Patent: May 14, 2019

(54) ALARM ARMING WITH OPEN ENTRY POINT

(71) Applicant: GOOGLE LLC, Mountain View, CA (US)

(72) Inventors: Kevin Charles Peterson, San Francisco, CA (US); Sophie Le Guen, Burlingame, CA (US); Maxime Veron, Los Altos, CA (US); Yash Modi, San Mateo, CA (US); Lawrence Au, Sunnyvale, CA (US); Mark Rajan Malhotra, San Mateo, CA (US); Julia Deluliis, Palo Alto, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/948,777

(22) Filed: Apr. 9, 2018

(65) Prior Publication Data
US 2018/0225938 A1 Aug. 9, 2018

Related U.S. Application Data

(63) Continuation of application No. 15/428,111, filed on Feb. 8, 2017, now Pat. No. 9,940,798, which is a
(Continued)

(51) Int. Cl.
*G08B 13/08* (2006.01)
*G08B 13/24* (2006.01)
(Continued)

(52) U.S. Cl.
CPC ............ *G08B 13/08* (2013.01); *G01R 33/02* (2013.01); *G08B 13/24* (2013.01); *G08B 25/008* (2013.01)

(58) Field of Classification Search
CPC ...... G08B 13/08; G08B 13/24; G08B 25/008; G01R 33/02
See application file for complete search history.

(56) References Cited

U.S. PATENT DOCUMENTS 4,701,669 A * 10/1987 Head .................... H05B 39/042
250/205
6,219,140 B1 * 4/2001 Kaplan ................. G01J 3/0251
250/208.1
(Continued)

FOREIGN PATENT DOCUMENTS

DE 102005018826 B3 * 10/2006
DE 102008022276 A1 * 11/2009
(Continued)

OTHER PUBLICATIONS

PCT/US2015/067820, International Search Report and Written Opinion issued in PCT/US2015/067820 dated Apr. 6, 2016, p. 12 (Year: 2016).*
(Continued)

*Primary Examiner* — Leon Flores
(74) *Attorney, Agent, or Firm* — Morris & Kamlay LLP

(57) ABSTRACT

A magnet and magnetometer may be integrated into a smart home environment and allow it to be placed into an away mode of operation despite an entry point being semi-open. The disclosed implementations can detect a magnetic field strength and determine, based on the detected field strength, an approximate distance that a moveable partition is open. In some configurations, the presence of a second magnetic source can be detected. A notice may be generated based on one or more signals received from the magnetometer. The notice may be sent to a controller, a remote system, a remote device, and/or a client device as disclosed herein.

24 Claims, 13 Drawing Sheets

Related U.S. Application Data continuation of application No. 14/585,226, filed on Dec. 30, 2014, now Pat. No. 9,569,943.

(51) Int. Cl.
*G01R 33/02* (2006.01)
*G08B 25/00* (2006.01)

(56) References Cited

U.S. PATENT DOCUMENTS

| | | | | |
|---|---|---|---|---|
| 6,263,260 B1* | 7/2001 | Bodmer | ............. | G05D 23/1905 700/275 |
| 6,415,295 B1* | 7/2002 | Feinberg | ............. | G09F 3/0288 |
| 6,880,957 B2* | 4/2005 | Walters | ............. | F21V 23/0442 250/205 |
| 7,403,109 B2* | 7/2008 | Martin | ............. | G08B 29/24 340/506 |
| 7,608,815 B2* | 10/2009 | Sharma | ............. | H01L 31/02019 250/238 |
| 7,978,069 B2* | 7/2011 | Wu | ............. | G08B 29/188 340/541 |
| 8,510,255 B2* | 8/2013 | Fadell | ............. | G05B 15/02 706/52 |
| 8,848,202 B2* | 9/2014 | Dyer | ............. | G01S 17/026 356/614 |
| 9,064,451 B2* | 6/2015 | Lynch | ............. | G06F 3/0412 |
| 9,129,548 B2* | 9/2015 | Zheng | ............. | G09G 5/10 |
| 9,569,943 B2* | 2/2017 | Peterson | ............. | G08B 13/24 |
| 2001/0048030 A1* | 12/2001 | Sharood | ............. | G05B 19/00 236/49.3 |
| 2003/0071739 A1* | 4/2003 | Addy | ............. | G08B 13/08 340/686.1 |
| 2004/0030531 A1* | 2/2004 | Miller | ............. | A61B 5/0002 702/182 |
| 2004/0032326 A1* | 2/2004 | Nakamura | ............. | G08B 13/193 340/567 |
| 2006/0181401 A1* | 8/2006 | Martin | ............. | G08B 15/002 340/506 |
| 2007/0220907 A1* | 9/2007 | Ehlers | ............. | F25B 49/005 62/126 |
| 2008/0018474 A1* | 1/2008 | Bergman | ............. | G08B 13/2471 340/572.7 |
| 2008/0094203 A1* | 4/2008 | Kogan | ............. | G08B 25/10 340/506 |
| 2008/0157964 A1* | 7/2008 | Eskildsen | ............. | G08B 13/08 340/545.1 |
| 2008/0290803 A1* | 11/2008 | Santo | ............. | G09G 3/3413 315/151 |
| 2009/0102653 A1* | 4/2009 | McGinnis | ............. | E05B 45/06 340/551 |
| 2009/0140056 A1* | 6/2009 | Leen | ............. | G05B 13/02 236/49.3 |
| 2010/0019902 A1* | 1/2010 | Mullet | ............. | G08B 13/08 340/546 |
| 2010/0102730 A1* | 4/2010 | Simon | ............. | F21V 23/0464 315/152 |
| 2010/0127854 A1* | 5/2010 | Helvick | ............. | G08B 25/008 340/539.14 |
| 2010/0242368 A1* | 9/2010 | Yulkowski | ............. | E05F 15/50 49/349 |
| 2010/0289644 A1* | 11/2010 | Slavin | ............. | G08B 13/2402 340/568.1 |
| 2011/0046805 A1* | 2/2011 | Bedros | ............. | H04L 12/2809 700/291 |
| 2011/0221350 A1* | 9/2011 | Staab | ............. | H05B 37/0218 315/154 |
| 2011/0304541 A1* | 12/2011 | Dalal | ............. | G06F 3/017 345/158 |
| 2011/0316655 A1* | 12/2011 | Mehraban | ............. | H01H 5/02 335/207 |
| 2012/0007713 A1* | 1/2012 | Nasiri | ............. | G06F 1/1694 340/5.81 |
| 2012/0062126 A1* | 3/2012 | Wu | ............. | H05B 37/0218 315/151 |
| 2012/0186774 A1* | 7/2012 | Matsuoka | ............. | F24F 11/30 165/11.1 |
| 2013/0049610 A1* | 2/2013 | Chen | ............. | H04B 33/0818 315/159 |
| 2013/0163619 A1* | 6/2013 | Stephanson | ............. | G08C 15/02 370/537 |
| 2013/0173064 A1* | 7/2013 | Fadell | ............. | G05D 23/1902 700/276 |
| 2013/0245838 A1* | 9/2013 | Zywicki | ............. | G05D 23/1905 700/278 |
| 2013/0257611 A1* | 10/2013 | Lamb | ............. | G08B 13/02 340/501 |
| 2013/0300564 A1* | 11/2013 | Lamb | ............. | G08B 25/008 340/573.4 |
| 2013/0338839 A1* | 12/2013 | Rogers | ............. | G05D 23/1904 700/278 |
| 2014/0006823 A1* | 1/2014 | Lamb | ............. | H02J 13/0086 713/323 |
| 2014/0062460 A1* | 3/2014 | Singh | ............. | G01R 21/133 324/118 |
| 2014/0062466 A1* | 3/2014 | Thibault | ............. | G01B 7/14 324/207.22 |
| 2014/0132578 A1* | 5/2014 | Zheng | ............. | G09G 5/10 345/207 |
| 2014/0191862 A1* | 7/2014 | Haines | ............. | G08B 13/2494 340/539.11 |
| 2014/0218181 A1* | 8/2014 | Musham | ............. | G08C 17/02 340/12.5 |
| 2014/0263977 A1* | 9/2014 | Jones | ............. | G01J 1/4204 250/214 AL |
| 2014/0266669 A1* | 9/2014 | Fadell | ............. | G05B 19/042 340/501 |
| 2014/0292208 A1* | 10/2014 | Chemel | ............. | H05B 33/0854 315/154 |
| 2014/0292481 A1* | 10/2014 | Dumas | ............. | G07C 9/00111 340/5.61 |
| 2014/0313032 A1* | 10/2014 | Sager | ............. | H04Q 9/00 340/539.17 |
| 2015/0092186 A1* | 4/2015 | Wieser | ............. | G01J 1/4204 356/43 |
| 2015/0161882 A1* | 6/2015 | Lett | ............. | G08B 25/001 340/506 |
| 2015/0223309 A1* | 8/2015 | Mohan | ............. | G05B 15/02 315/153 |
| 2015/0308178 A1* | 10/2015 | Warren | ............. | E05F 15/70 700/275 |
| 2016/0073475 A1* | 3/2016 | Klein Swormink | ............. | H05B 37/0272 315/151 |

FOREIGN PATENT DOCUMENTS

| | | | |
|---|---|---|---|
| EP | 1713045 A2 | * | 10/2006 |
| EP | 1912180 A2 | * | 4/2008 |
| WO | WO-2011141056 A1 | * | 11/2011 |
| WO | WO-2014154738 A1 | * | 10/2014 |
| WO | WO-2014170193 A1 | * | 10/2014 |

OTHER PUBLICATIONS

International Search Report and the Written Opinion of the International Searching Authority for PCT/US2015/061155 dated Feb. 9, 2016 (Year: 2016).*

International Search Report and Written Opinion dated Feb. 12, 2016 issued in International Application No. PCT/US2015/061157 (Year: 2016).*

Deng, The Design of Burglar Alarm Circuit Based on the Magnetic Field Sensor, Comp. Msrmt., Control & Sensor Network (CMCSN), 2012 Int'l Conf. IEEE, Jul. 7, 2012, 199-200 (Year: 2012).*

(56) References Cited

OTHER PUBLICATIONS

PCT/US2015/067802, International Search Report and Written Opinion issued in PCT/US2015/067802 dated Apr. 4, 2016, Apr. 4, 2016, p. 11 (Year: 2016).*

* cited by examiner

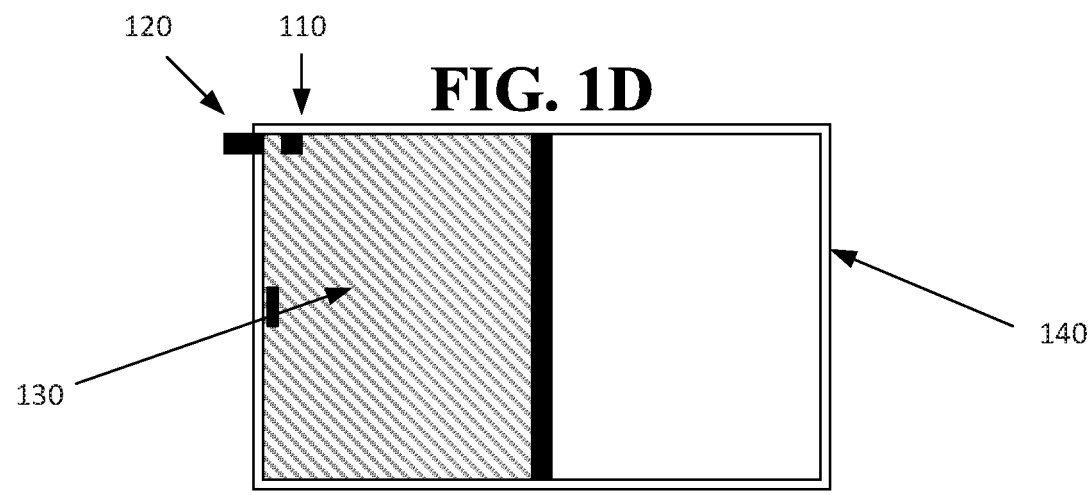
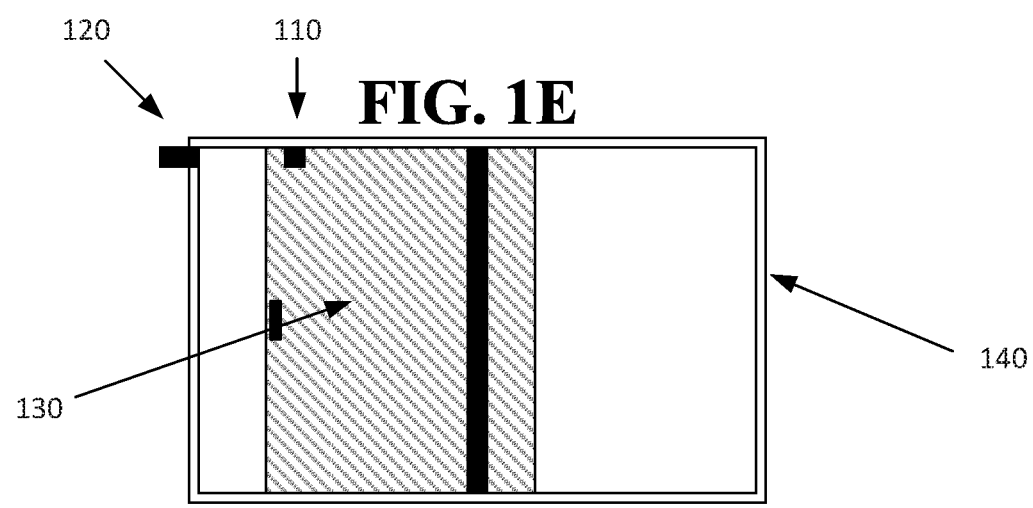
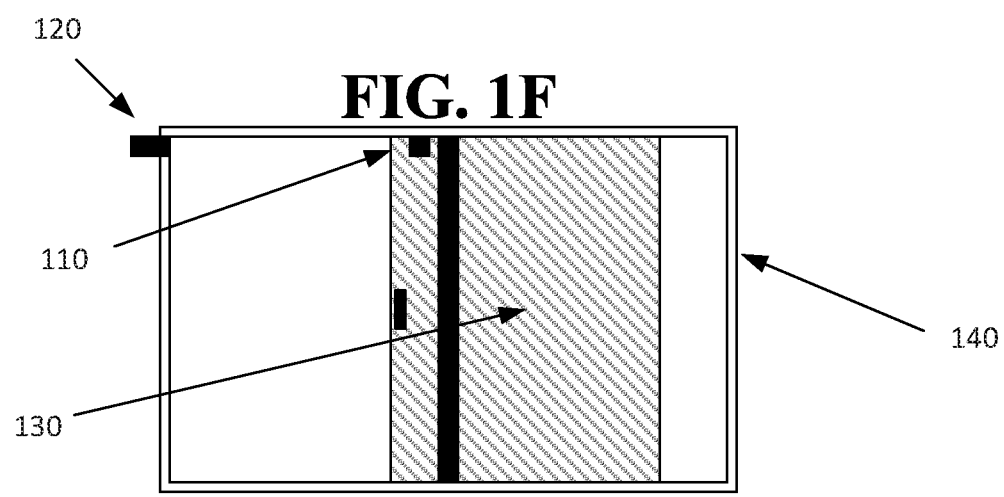

ALARM ARMING WITH OPEN ENTRY POINT

CROSS-REFERENCE TO RELATED APPLICATIONS

This application is related to U.S. application Ser. No. 14/585,225, filed Dec. 30, 2014, issued as U.S. Pat. No. 9,332,616 on May 3, 2016, and to U.S. application Ser. No. 14/585,222, filed Dec. 30, 2014, the contents of which are hereby incorporated by reference in their entirety.

BACKGROUND

Conventional door and window security systems may utilize a magnet and magnetometer to provide an indication of whether an entry point is open or closed. This binary result may be utilized by a home security system to determine whether it can be placed in an "away" mode or a "home" mode. An "away" mode for the home security system may be utilized, for example, when the occupants are away (e.g., at work during the day). In the away mode, the entry points into a home may be monitored for intrusion. A "home" mode may refer to the home security system's state when the occupants are home. The mode can affect the actions taken by the security system in response to sensed activities in the home. For example, in home mode, the sensed opening of an exterior door may result in no action being taken by the security system. In the away mode, the sensed opening of the same door may be construed as an intrusion detection and cause an alert to be sent to law enforcement. There can also be an intermediate mode between stay and away. For example, there can be a "night" mode for when occupants are sleeping in the home. This mode can, for example, refrain from triggering an alert to the police based on sensed movement in the bedroom and hallways, but can send such an alert when an exterior door is opened. The system can transition between modes when a user enters a security code into an entryway security system. Such modes apply to the security system for the whole home.

A home security system that has a home and/or an away state, however, may not detect nuances in usage of entry points and desired security features. For example, if the system determines that a door is open, the security system may not allow an occupant to place the system into an away mode. The system may notify the occupant that it cannot be placed in the away mode because an entry point is open. As an example, an occupant may desire to leave a door or window slightly ajar or open to allow fresh air into the home. To circumvent the home security system, the occupant may place a second magnet in a position that can be detected by the magnetometer when the door or window is open. Thus, the magnetometer may be tricked into thinking that the door or window is closed because it detects the presence of the magnetic field emitted by the magnet. Consequently, the home security system may be placed into an away mode. The placement of a second magnet can also be utilized by an intruder to trick the home security system into believing that a window or door is closed when it is actually open.

Some other examples of security systems for entry points employing a magnetometer and a magnet include government and bank installations. These examples tend to utilize extremely complex security systems that may utilize balanced read switches that require a specific magnetic field in order to trigger a sensor. The installation of such security systems is very complex, often requiring a multi-meter to be connected to the magnetometer to ensure that the sensor is placed in the correct spot.

BRIEF SUMMARY

According to an implementation of the disclosed subject matter, a system is provided that includes a magnet fixed to an enclosure of a moveable partition and a processor. The processor may be configured to receive a magnetometer signal. The processor may determine that the magnetometer signal corresponds to a magnetic field strength less than a magnetic field strength when the moveable partition is substantially closed. The processor may be configured to receive a request to place a home security system into an away mode. It may determine that the magnetic field strength is above a threshold level. Based thereon and responsive to the request, the processor may place the home security system into the away mode.

In an implementation, a magnetometer signal may be received. The present magnetic field strength may be determined, based on the received magnetometer signal, to be less than a closed magnetic field strength corresponding to a magnetic field strength sensed by the magnetometer when a moveable partition is closed. A request to place a home security system into an away mode may be received. A present magnetic field strength may be determined to be greater than a threshold magnetic field strength. Based on the determination that the present magnetic field strength is greater than the threshold magnetic field strength and responsive to the request, the home security system may be placed into the away mode.

A home security system of a home may be determined to be in a home mode. The home mode, as described above, may allow movement through an entry point of the home. The home security system may include a magnetometer and a magnet associated with an entry point of the home. The magnetometer may be configured to detect a magnetic field of the magnet when the magnetometer is a within a threshold distance from the magnet. A request to place the home security system into an away mode may be received. The away mode, as described earlier, may detect an intrusion into the entry point and define a response to the intrusion. A signal may be received from the magnetometer indicating a magnetic field strength. The entry point may be determined to be open a distance based on the magnetic field strength detected by the magnetometer. The distance that the entry point is open may be determined to be within the threshold distance. Responsive to the request, the home security system may be placed into the away mode.

A home security system is disclosed that includes a magnetometer and a magnet that are associated with an entry point of a home. The magnetometer may be configured to detect a magnetic field of the magnetic when the magnetometer is within a threshold distance from the magnet. The system may include a processor that is configured to determine that the system of a home is in a home mode. The home mode may allow movement through an entry point of the home without dispatching an alarm. The processor may be configured to receive a request to place the system into an away mode that detects intrusion into the entry point of the home and defines a response to the intrusion. The processor may receive a signal from the magnetometer indicating a magnetic field strength and it may determine the entry point is open based on the magnetic field strength detected by the magnetometer. The processor may be configured to determine that the distance is within the threshold distance and may place the home security system into the away mode in response to the request.

A system is disclosed that includes a magnet fixed to a moveable partition that is surrounded by an enclosure and a processor. The processor may be configured to receive a magnetometer signal and determine that the magnetometer signal corresponds to a magnetic field strength that is greater than a magnetic field strength when the moveable partition is substantially closed. The processor may be configured to receive a request to place a home security system into an away mode. The processor may determine that the magnetic field strength is above a threshold level. Based on the determination that the magnetic field strength is above the threshold level and responsive to the request, the processor may place the home security system into the away mode.

In an implementation, a system is provided that includes a magnet fixed to a moveable partition surrounded by an enclosure and a processor. The processor may be configured to receive a magnetometer signal and determine that the magnetometer signal corresponds to a magnetic field strength greater than a magnetic field strength when the moveable partition is substantially closed. The processor may receive a request to place a home security system into an away mode. It may determine that the magnetic field strength is below a threshold level. Based on the determination that the magnetic field strength is below the threshold level and responsive to the request, the processor may maintain the home security system into the home mode.

Additional features, advantages, and implementations of the disclosed subject matter may be set forth or apparent from consideration of the following detailed description, drawings, and claims. Moreover, it is to be understood that both the foregoing summary and the following detailed description provide examples of implementations and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

FIG. 1D is an example of an enclosure for a moveable partition in which the moveable partition is in a closed position, the magnet is fixed to the moveable partition, and the magnetometer is fixed to the enclosure as disclosed herein.

FIG. 1E is an example of the enclosure for the moveable partition in which the moveable partition is in a semi-open position, the magnet is fixed to the moveable partition, and the magnetometer is fixed to the enclosure as disclosed herein.

FIG. 1F is an example of the enclosure for the moveable partition in which the moveable partition is in an open position, the magnet is fixed to the moveable partition, and the magnetometer is fixed to the enclosure as disclosed herein.

DETAILED DESCRIPTION

Figure 1A:
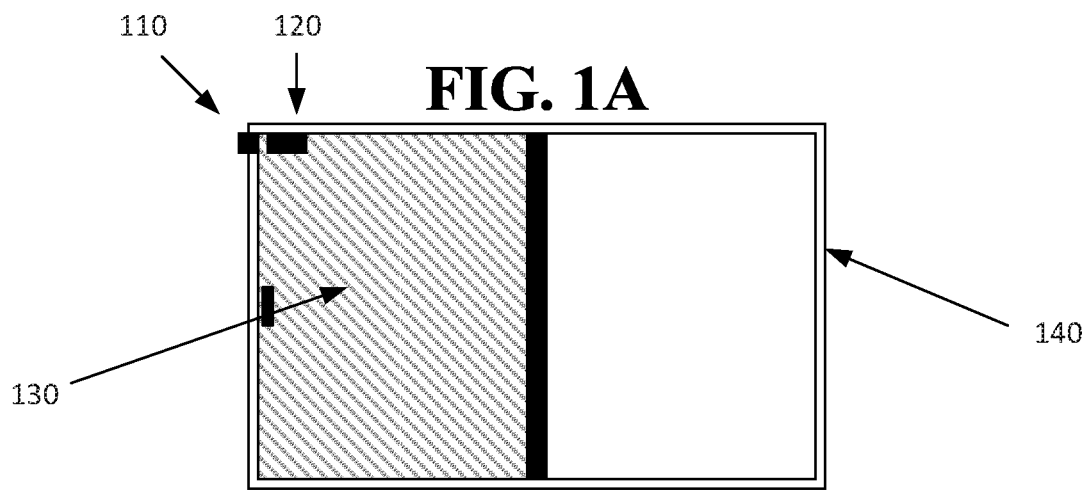
FIG. 1A is an example of an enclosure for a moveable partition in which the moveable partition is in a closed position, the magnet is fixed to the enclosure, and the magnetometer is fixed to the enclosure as disclosed herein.

Typical home security systems provide for a binary determination of whether or not an entry point, such as a door or window, is open or closed. The disclosed implementations may allow a user to place a home security system into an away mode even though an entry point may not be entirely secure. For example, a window may be open 3 centimeters (cm.) The disclosed system may determine that the window is open, but that it is not open so far as to present a security risk (e.g., a would be intruder cannot slip through the open window). The home security system may utilize a magnetometer such as a compass affixed to a door that detects a magnet placed on the enclosure for the door. When the door is proximal to the magnet, the security system may determine that it is within a threshold distance of the magnet (e.g., substantially closed) and allow a user to place the security system into an away mode.

The compass can provide an indication corresponding to a magnetic field and can also provide an indication that a second magnetic field is proximal to the entry point. For example, the compass may provide analog data that can be received by a processor. The processor may determine that the compass readings are anomalous due to the presence of a second magnetic field as compared to when there was only a single magnetic field. The compass may determine that there is an increase in magnetic field strength and/or that there is an orientation change in the field. For example, the compass may have historically detected a single magnetic field in one spot, but it may now detect the presence of a second magnetic field in a different direction from the first magnetic field. Thus, the compass can determine the orientation or orientation change from a reference point of a moveable partition (e.g., door or window) to which it is associated. While many examples described herein are in the context of a door, other objects may be utilized according to implementations disclosed herein. For example, an implementation can be used in connection with a window that slides between an open state and a closed state, a garage door, a cabinet door, a file drawer, a vehicle tailgate, etc. Thus, the magnetometer (e.g., compass) data may indicate proximity to the closed position and/or the presence of a second magnetic field.

Initially, the magnetometer's data may be utilized to determine a placement for the magnetometer to prevent interference from other magnetic fields. The compass may be controlled by a microcontroller as described below. The microcontroller may establish a sampling rule for the compass. For example, it may sample the compass, every five seconds or in response to a mode change for the home security system. A sampling may include receiving a signal that is automatically sent from the compass according to the sampling frequency. Another sampling may include sending a query to the compass periodically according to the sampling frequency and then receiving a response corresponding to sensed movement of moveable partition at an entry point.

Figure 1B:
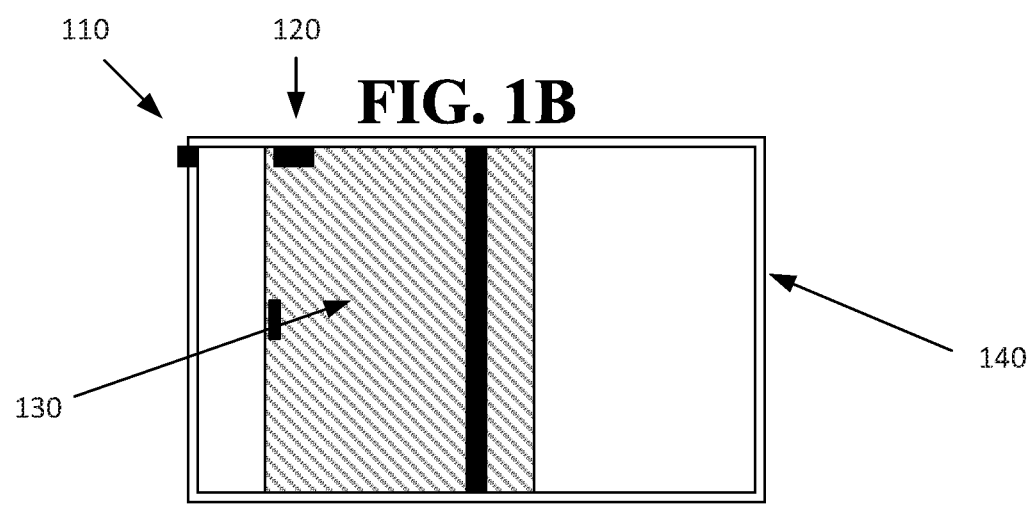
FIG. 1B is an example of the enclosure for the moveable partition in which the moveable partition is in a semi-open position, the magnet is fixed to the enclosure, and the magnetometer is fixed to the enclosure as disclosed herein.
Figure 1C:
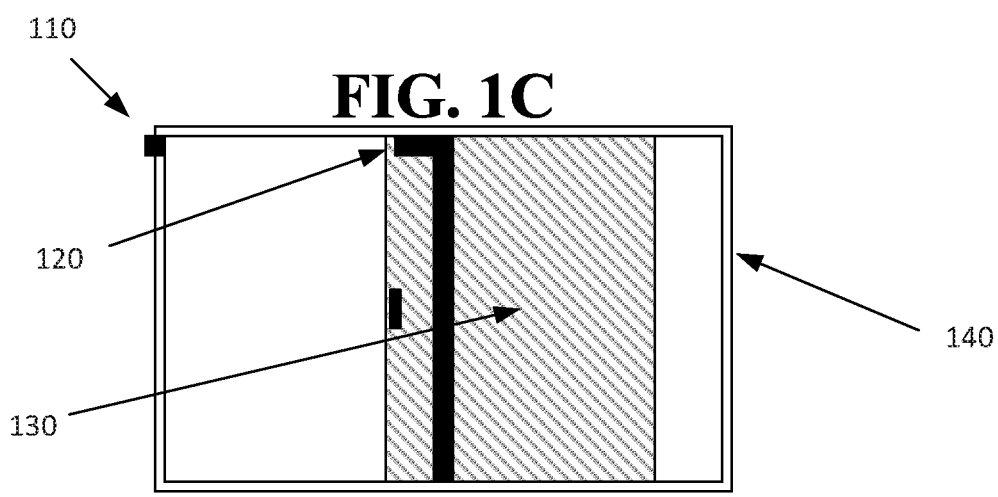
FIG. 1C is an example of the enclosure for the moveable partition in which the moveable partition is in an open position, the magnet is fixed to the enclosure, and the magnetometer is fixed to the enclosure as disclosed herein.

FIG. 1A and FIG. 1D are examples of an enclosure 140 for a moveable partition 130 in which the moveable partition 130 is in a closed position. FIG. 1B and FIG. 1E are examples of the enclosure 140 for the moveable partition 130 in which the moveable partition 130 is in a semi-open position. FIG. 1C and FIG. 1F are examples of the enclosure 140 for the moveable partition 130 in which the moveable partition 130 is in the open position. In FIGS. 1A-1C, the magnet 110 is located on or very near the enclosure 140 while in FIGS. 1D-1F the magnet 110 is located on the moveable partition 110. Similarly, in FIGS. 1A-1C, the magnetometer (e.g., compass) 120 is located on the moveable partition 130 while in FIGS. 1D-1F the magnetometer 120 is located on or near the enclosure 140. The implementations disclosed herein may include, therefore, many different permutations for positioning the magnet 120 and/or magnetometer 110. For example, in FIGS. 1A-1F, the magnet 110 and magnetometer 120 are shown near the top of the enclosure 140 and/or moveable partition 130. They may be similarly positioned at the bottom thereof according to the implementations disclosed herein.

Figure 1G:
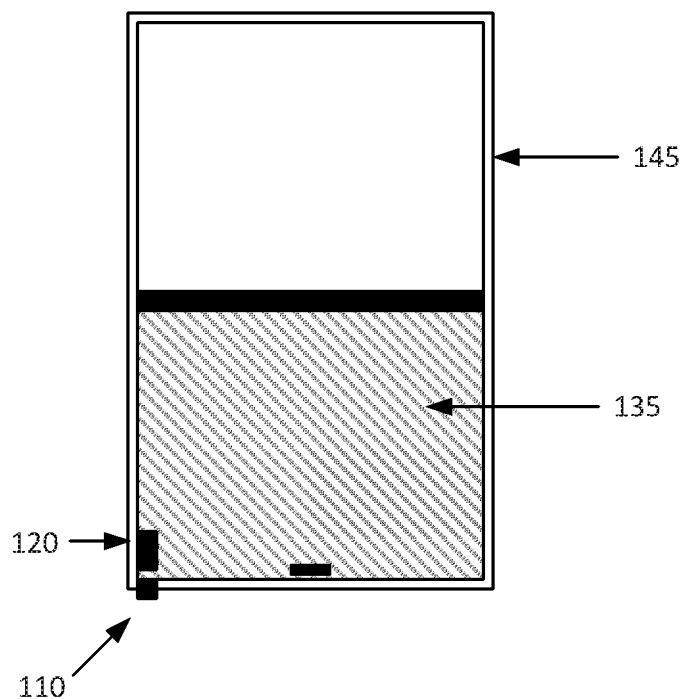
FIG. 1G shows an example of a window as the moveable partition as disclosed herein.

The enclosure shown in FIGS. 1A-1F may be a doorjamb and the moveable partition may be a sliding door. Other types of enclosures and/or doors may be utilized with the implementations disclosed herein. For example, the door can be actuated on a hinge mechanism. FIG. 1G shows an example of a window 135 as the moveable partition. The window casing 145 may be an enclosure for the window 135. Other types of enclosures and moveable partitions (e.g., garage door, shed doors, etc.) may be used in accordance with the implementations disclosed herein.

Figure 2:
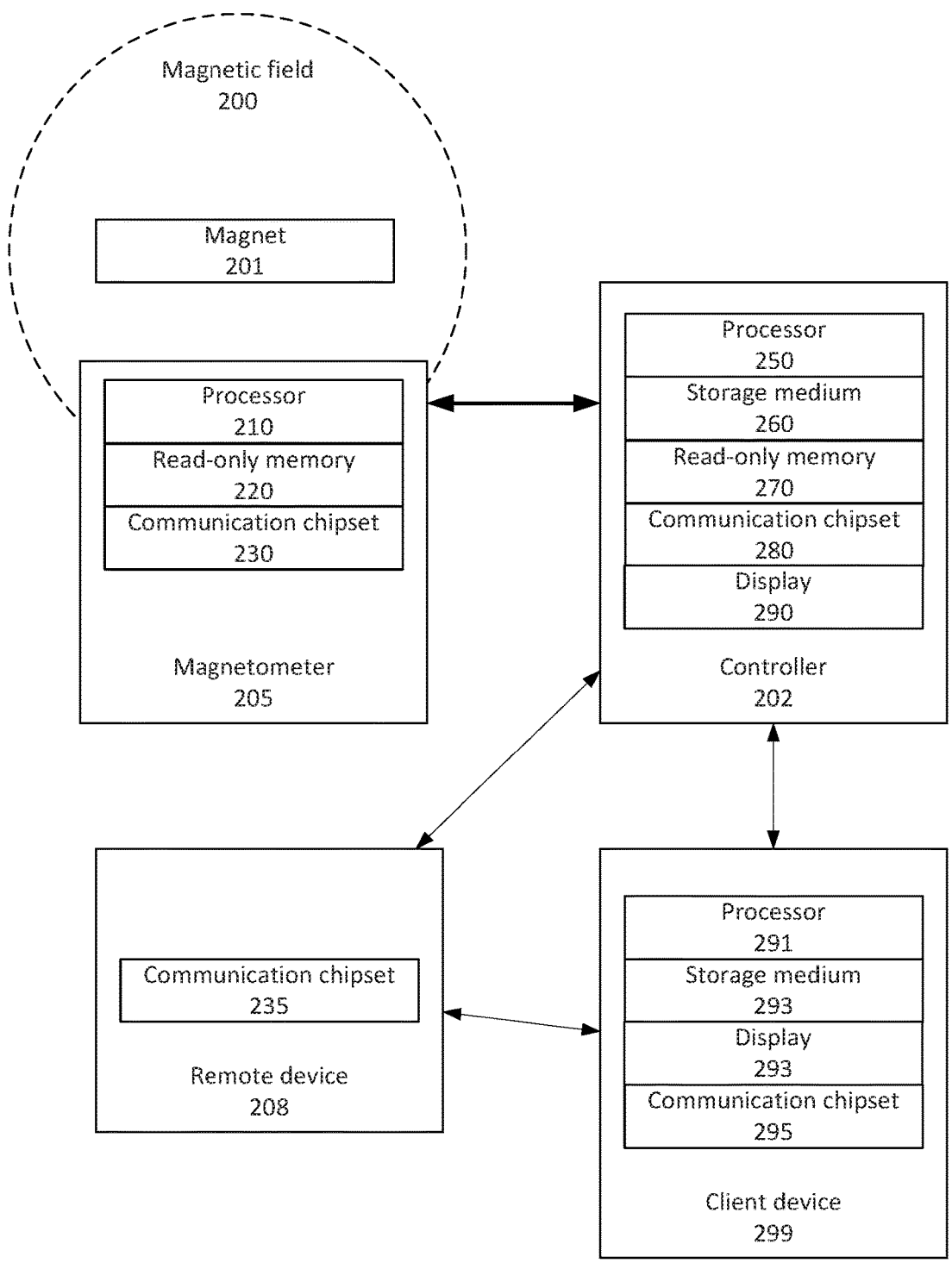
FIG. 2 is an example of a system that can place a home security system into an away mode based on the signal from the magnetometer and a user request according to an implementation.

FIG. 2 provides an example of a system that can place a home security system into an away mode based on the signal from the magnetometer and a user request. The system may include a magnet 201 and magnetometer 205 that may be situated, for example, as illustrated in FIGS. 1A-1G. The magnet may emit a magnetic field 200 that can be detected by the magnetometer 205 when it is proximal to the magnet 201. The size of the magnetic field 200 may vary depending on the strength of the magnet 201 used and/or interference from structural or electrical phenomenon. Similarly, the sensitivity of the magnetometer 205 may be capable of detecting the magnet 201 at a greater distance away because it can detect a weaker magnetic field 200. The magnetometer 205 may include a processor 210 that operates according to instructions stored in the read only memory 220. The magnetometer 205 may include a communication chipset 230 (e.g., a radio antenna, Bluetooth chipset, Near-Field Communication, etc.) through which the magnetometer 205 can connect to other devices and/or networks (e.g., Wi-Fi, mesh network, etc.).

The magnetometer 205 may communicate readings or data indicating the direction and/or strength of a magnetic field 200 to, for example, a controller and/or remote system 202. The controller and/or remote system 202 are described in detail below. The controller may be responsible for controlling the functions of a home security system of which the magnetometer 205 and magnet 201 are a part. For example, the magnet 201 and magnetometer 205 may be responsible for providing input as to the security of a particular entry point (e.g., whether it is open, semi-open, or closed or secure). The controller 202 may include a processor 250 that can read instructions stored to the read only memory 270. The controller 202 may include a storage medium 260 for storing input data it receives from the magnetometer 205 and/or other sensors with which it is associated (e.g., other magnetometers, light sensors, microphones, etc.) through the communication chipset 260. The controller 202 may include a display 290 with which a user may control various functions of the smart home or home security system. For example, the user may configure times for the system to transition from a home mode to an away mode and/or smart lighting features and/or HVAC functions. The controller 202 may communicate with a remote system (described below), a remote device 208, and/or a client device 299. The remote device 208 may be keypad, a device scanner, or the like through which a user can enter, for example, a PIN or password to access the interior premises of a home. The remote device 208 may communicate through a chipset 235 to the controller 202. In some configurations, the remote device 208 may be a device scanner that includes a near field communication chipset (NFC). A user may bring a NFC-enabled device (e.g., a FOB, a smartphone, etc.) near the device scanner. The remote device 208 may receive a device ID for the user and request a password or PIN from the user. If the user correctly enters the PIN, the door with which the remote device 208 is associated may open.

In some configurations, a client device 299 may communicate with the controller via the communication chipset 295. For example, the client device 299 may be notified of potential intrusions into the home or the status of the lights, garage door, HVAC, etc. The client device 299 may contain a display through which a user interface is provided that allows the user to send/receive input from the controller 202 and/or remote system. The client device 299 may contain a storage medium 293 for storing the user's preferences and/or input obtained from the controller 202 and/or remote system. The processor 291 may handle input and output requests to and from the client device 299. In some configurations of the system, the magnetometer 205 may communicate input data to the client device directly or through a remote system. The processor 291 of the client device may determine the various states of the entry point.

One of the magnetometer or magnet may be fixed to an enclosure such as a window casing, a doorjamb, a garage door track, or any other structural and/or non-moving component near a moveable partition. A moveable partition may refer to any structure that separates an interior space from an exterior space such as a door, window, garage door, safe door, etc. The positioning of the magnet and magnetometer may be determined based on a trial and error technique. For example, a user may place a magnet in a desired location. The user may then slide the magnetometer along a moveable partition near the magnet. The magnetometer may contain one or more LEDs to indicate the relative strength of the magnetic field. A green LED may be provided when the magnetometer detects a magnetic field strength above a threshold value. The user may be instructed to position the magnetometer in the center of the "green" range.

As shown in FIG. 2, a processor 250 may receive a magnetometer signal. As indicated above, a processor belonging to the remote system and/or a processor 291 of the client device 299 may perform the processes disclosed herein. The magnetometer 205 may provide measurements of the direction and/or magnitude of a magnetic field. It may express these measurements in the form of amperes per meter, teslas, newtons per meter per ampere, etc. The magnetometer 205 may sample the magnetic field continuously or periodically. The generated measurements may be provided immediately to the controller 202, client device 299, remote system, etc. and/or temporarily stored on the magnetometer 205 and transmitted periodically upon accrual of a specified amount of data.

Figure 3:
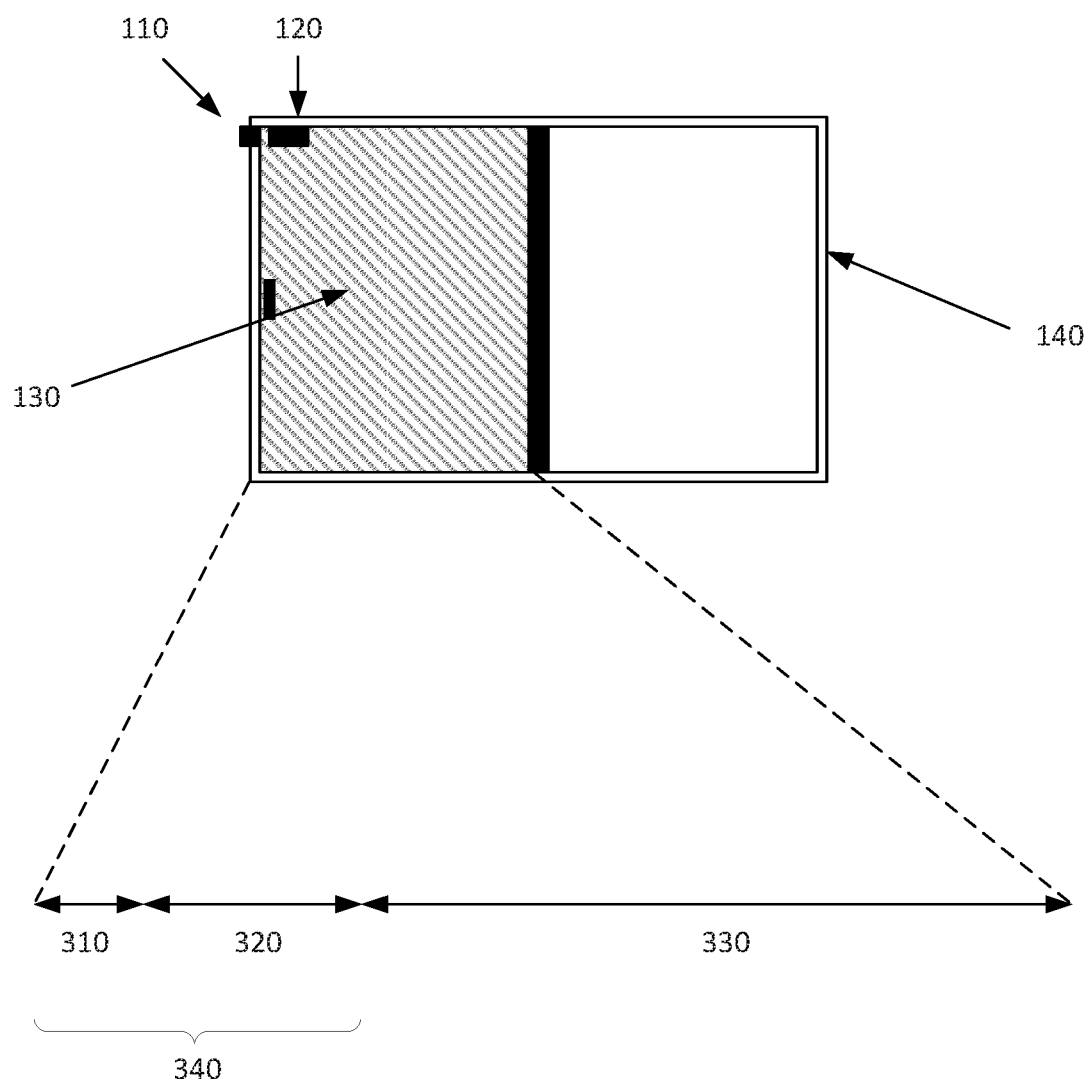
FIG. 3 is an example of a door that is substantially shut as disclosed herein.

In an implementation of the system, the processor may determine that the magnetometer signal corresponds to a magnetic field strength less than a magnetic field strength when the moveable partition is substantially closed. FIG. 3 is an example of a door that is substantially shut. The range the door slides may be represented by the combined distance of 310, 320, and 330. In some configurations, the range of movement may be arcuate, such as a hinged door, or have other paths of movement specific to the moveable partition. Substantially closed may refer to a small portion of the moveable range of the moveable partition. In the example shown in FIG. 2, the range of movement represented by 310 may be referred to as substantially closed. It may refer to the moveable partition being closed 95% or more of the moveable range (e.g., closer to the magnet in this example). The range of movement represented by 320 may be referred to as semi-open. It may refer to the moveable enclosure being 94% to 80% closed. The range of movement represented by 330 may be deemed open. The percentages representing open, semi-open, and closed may be configured as may be required for an individual and/or specific home security system. As an example, a substantially closed door may be closed but not latched (e.g., the door can be pushed open) or cracked open (e.g., less than 1 cm of distance between the door and the doorjamb). A semi-open door may have between 1 cm and 15 cm of separation from the doorjamb. An open door may be any door having greater than 15 cm of separation from the doorjamb. A threshold level within which the home security system may be placed in the away mode is represented by 340. It includes both the substantially closed 310 and semi-open 320 ranges.

Figure 4:
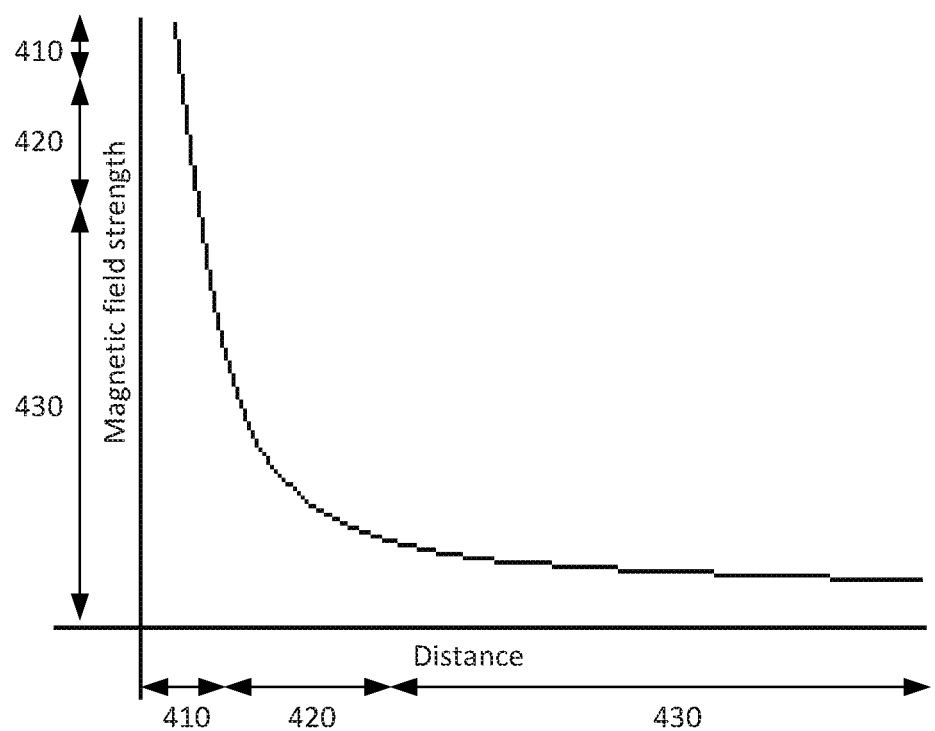
FIG. 4 is an example representation of a magnetic field strength for a magnet that is detected by a magnetometer over a range of distances as disclosed herein.

The magnetometer may detect a magnetic field in a distance dependent manner. FIG. 4 is an example representation of a magnetic field strength for a magnet that is detected by a magnetometer over a range of distances as disclosed herein. The range of the graph represented by 410 may refer to measurements obtained by the magnetometer for which it is completely saturated. The semi-open range represented by 420 may be defined by the strength measurements of the magnetometer contained therein. The moveable partition may be considered open if it is within the strength and/or distance defined by 430. Thus, when the magnetometer presents one or more readings or signal regarding the magnetic field strength, the distance the moveable partition is open can be determined. In some instances, the system may classify the magnetometer readings into one of the categories disclosed herein (e.g., open, semi-open, and/or closed) rather than providing a specific distance approximation. The boundary between the closed and semi-open ranges 410, 420 and the semi-open and open ranges 420, 430 may represent a first threshold and a second threshold, respectively. The system may utilize the magnetic field strength to differentiate the state of the moveable partition. It may, for example, determine that a moveable partition is semi-open because the magnetic field strength is below the first threshold that represents the boundary between 410 and 420 and above the second threshold between 420 and 430.

The processor may receive a request to place a home security system into an away mode. As described above, the away mode may refer to the home security system monitoring the home environment and/or premises for an intrusion and/or an abnormality (e.g., a fire, carbon monoxide, movement inside the home when all authorized occupants are not home, etc.). The request may be received by the controller and/or remote system. The request may be made from the client device, the remote device, and/or the controller as shown in FIG. 2. For example, a user may be the last person at home and leaving to go to work. The user may instruct the smart home to enter the away state after the user exits the home. In some configurations, the system may automatically enter the away state based on a determination that certain conditions have been met. For example, it may determine that all authorized occupants are more than 1 km away from the home based on GPS readings from the authorized occupants' smartphones. The request, therefore, may be generated by the controller and/or remote system.

The processor may determine that the magnetic field strength detected by the magnetometer is above a threshold level. In some configurations, the processor may request a sample from the magnetometer to determine whether the magnetic field strength is above the threshold level based on a current sample. The controller and/or remote system may store the last known state of the moveable partition based on a prior magnetometer input. It may activate the magnetometer only if a change in the home security or smart home mode is detected, a change with the moveable partition is detected, an intrusion is detected, and/or an abnormality is detected. In these events, it may request the magnetometer to provide a current sample and update the status of the moveable partition (e.g., store an indication of the status). The threshold level may be based on, for example, 340 in FIG. 3. For example, the threshold may be based on a magnetic strength, above which (e.g., a stronger field), the moveable partition may be deemed closer to the magnet or more closed. Based on the determination that the magnetic field strength is above the threshold level and responsive to the request, the processor may place the home security system into the away mode.

The processor may be configured to generate a notice that indicates the home security system is in the away mode and/or that the door is closed enough for it to enter the away mode. The notice may be sent to the client device and/or the controller and displayed thereon. A notice may indicate an identity of the moveable partition that has been deemed semi-open. For example, when the magnetometer is initially configured to communicate with the controller and/or remote system, a user may be requested to enter a name and/or position of the magnetometer (e.g., front door) that can be provided in the notice.

Subsequent to placing the smart home in the away mode, movement of the moveable partition may be detected. For example, while in the away mode, the magnetometer may be periodically sampled to ensure the lack of movement of the moveable partition. The system may generate a notice if it detects any movement or an amount of movement beyond a threshold amount. For example, the moveable partition may change from indicating that it is substantially closed to it is only semi-open or open or that it has changed from semi-open to open. The notice may be sent to a client device and/or a third party (e.g., law enforcement). The notice may indicate the movement, the location of the movement, time of the movement, etc. The notice may cause the controller to emit an audible warning and/or flash one or more lights located on the interior of the home.

In the event that the home security system is in an away mode and the moveable partition is in a semi-open state, if it detects a transition to an open state, it may generate a response to the movement. The response may be generation of a notice that can be sent to a client device. The response may request the controller to determine whether an authorized occupant is in the room in which the moveable partition is located.

In some configurations, the magnet and magnetometer may be positioned such that the magnetometer is saturated by the magnetic field from the magnet when it is in the semi-open position. The magnetic field strength when the moveable partition is closed may be less than the saturated magnetic field strength, but still above the field strength necessary for the home security system to be placed into an away mode. In such a configuration, the moveable partition may be open a greater distance while still allowing the home security system to be placed into an away mode.

Figure 5:
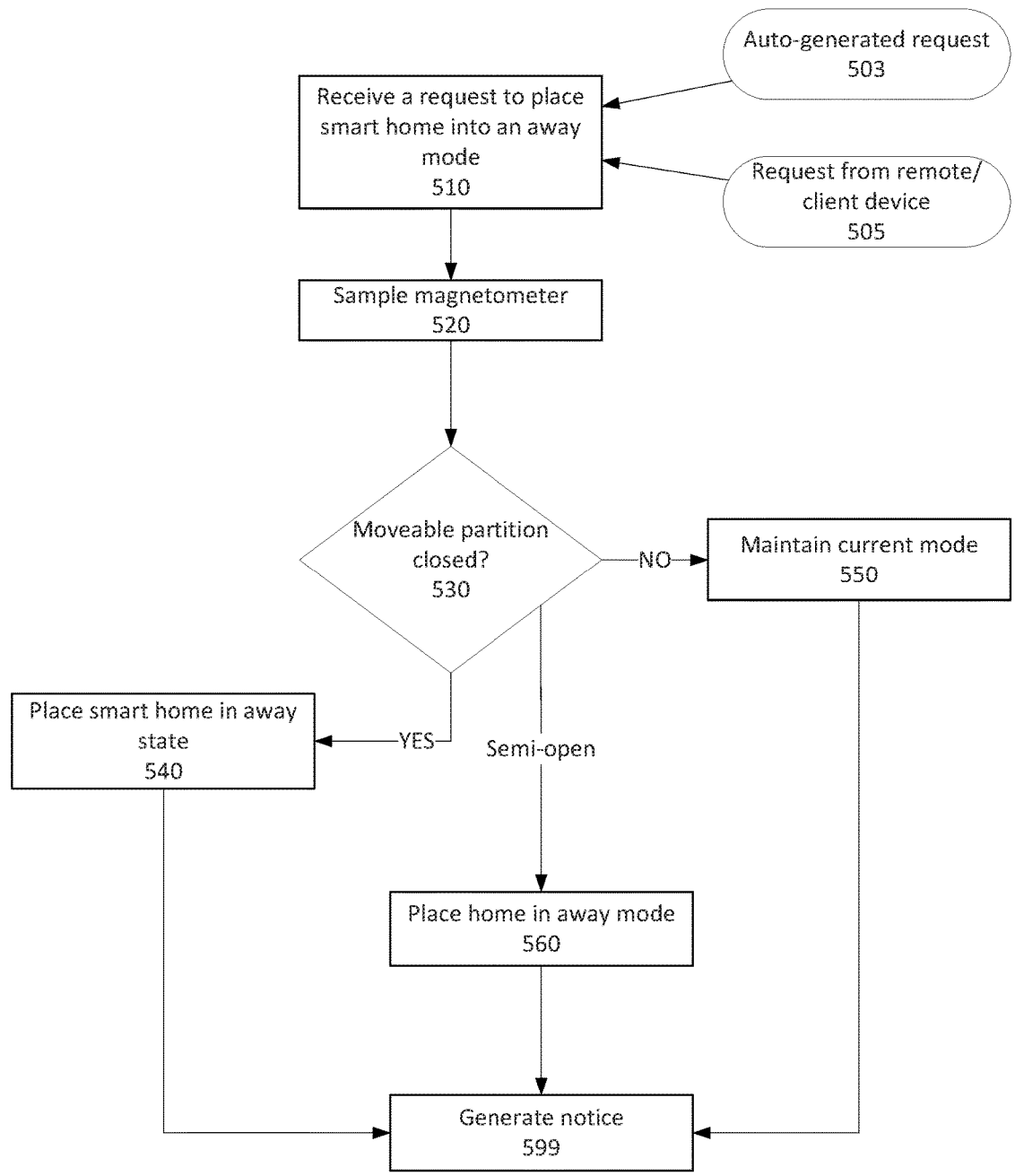
FIG. 5 is an example process for how the system may transition from a home state (or other state except an away state) to an away state as disclosed herein.

FIG. 5 is an example process for how the system may transition from a home state (or other state except an away state) to an away state. A request to place the system into an away state may be received at 510. The request may be auto-generated 503 in some instances. For example, the system may determine that the premises are not currently occupied by anyone and/or that all authorized users are not near the premises, e.g., beyond a geofence, beyond the perimeter of the house, etc. In some instances, the request may be received from a remote device or client device 505. For example, as a user exits a home, the user may enter in a code at a keypad near an entry point to place the system into the away mode. The user may place such a request using a controller prior to exiting the home. As another example, the user may place the request using a client device such as a smartphone and/or tablet.

Upon receiving the request to place the system into the away mode 510, the system may sample the magnetometer at 520. Based on the magnetometer readings, the system may determine at 530 whether the moveable partition is open, semi-open, or closed. If the system determines that the moveable partition is open, then it may maintain its current mode at 550. For example, the system may not be able to detect an intruder who enters the home through an open window. Thus, the system may not allow the user to place the system in an away mode. The system may generate a notice at 599 that may be emitted by the home (e.g., an audio cue such as a beep, a visual cue such as flashing a LED) and/or sent to a client device (e.g., the client device may receive a text message, email, etc.). In some configurations, when the system determines that a moveable partition is open at 530, it may notify the user of the particular moveable partition that is open (e.g., a notice may indicate, for example, "Bedroom 1 window is open."). It may present the user with the option to bypass the open moveable partition warning and continue to place the system in the away state despite the open moveable partition.

If the system determines that the moveable partition is closed, it may place the system into an away state at 540. The system may generate a notice to the user to indicate that it has placed the system into the away state at 599 as disclosed herein.

The system may determine that the moveable partition is in a semi-open state at 560. For example, the system may determine that a window or door is open, but it is within a threshold distance. The system may generate a notice for the user that notifies the user of the semi-open state. For example, it may indicate the particular moveable partition that is ajar. In some configurations, the notice may prompt the user to indicate whether to proceed with placing the system into the away state despite the semi-open moveable partition. In some configurations, the system may automatically be placed into an away mode at 560. If the home is automatically placed in an away mode when a moveable partition is in a semi-open state, a notice may be generated at 599 to indicate the semi-open moveable partition that is ajar and/or that the system has been placed into the away mode.

Figure 6:
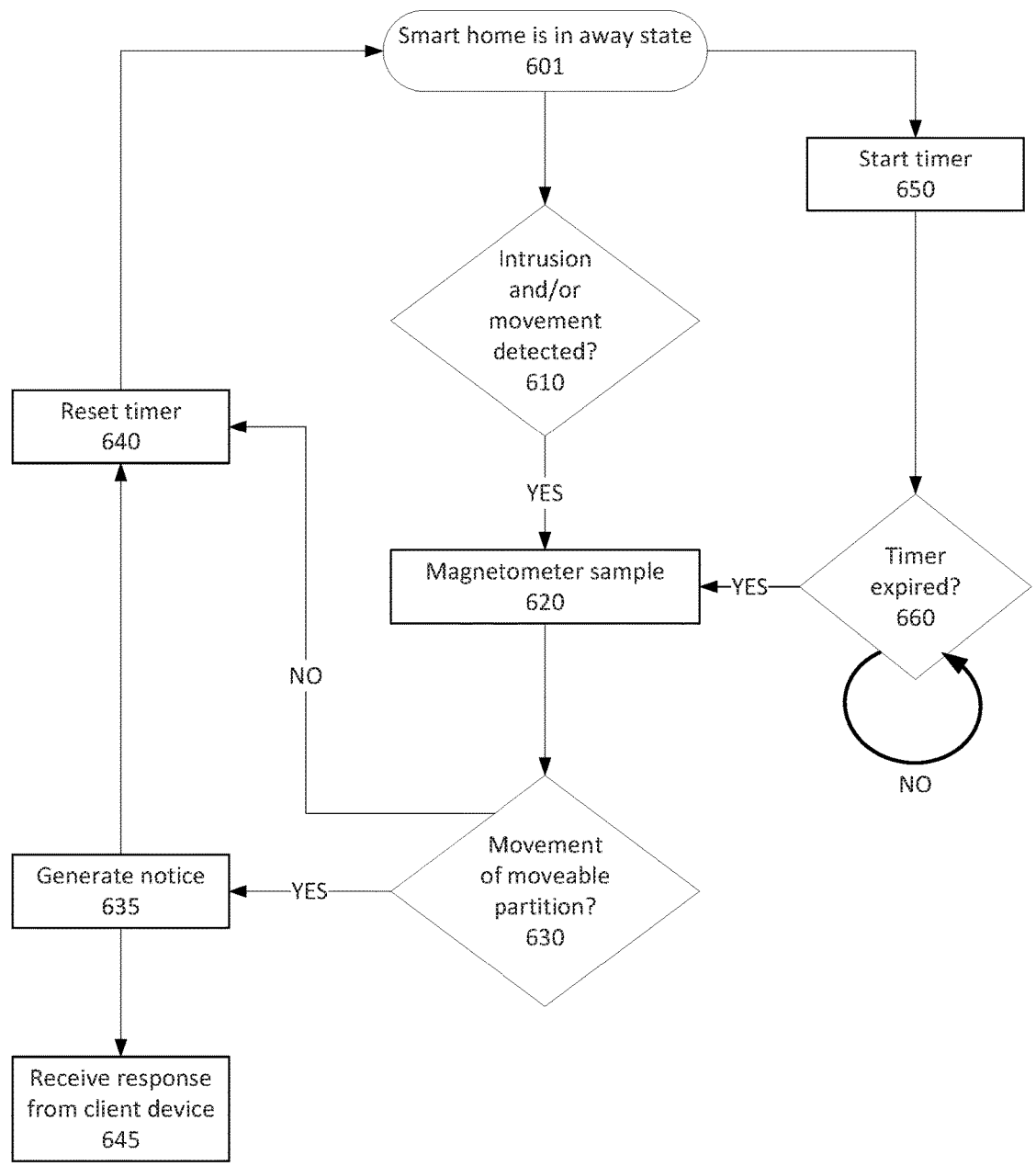
FIG. 6 is an example of how the magnetometer may be sampled while the smart home is in an away mode as disclosed herein.

FIG. 6 is an example of how the magnetometer may be sampled while the smart home is in an away mode. Beginning at 601, the security system or smart home may be in the away mode. A timer may be initiated at 650 upon entering the away state. The timer may be a count down or count up timer. For example, the timer may count down from five seconds. It may count up from zero seconds in some configurations. A processor may determine if the timer has expired at 660. The timer being expired may refer to the timer being at zero if it is counting down or the timer being past a threshold amount of time (e.g., five seconds). If the processor has not expired, the system may continue to monitor the timer at 660. If the timer has expired, the magnetometer may be sampled at 620. The system may determine whether the moveable partition has moved at 630. If there has been no movement the timer may be reset at 640. If the moveable partition has been moved or moved beyond a threshold distance, then the system may generate a notice. The notice may be sent to the controller, for example, to request the controller to check whether there are other abnormalities in the house such as movement in the room in which the moveable partition is located. In some configurations, the generated notice may be a visual and/or audio cue (such as an alarm sound or strobe light). The notice may be sent to a client device (e.g., personal computer, smartphone, laptop, etc.). The notice may indicate the amount of movement, time of the movement, and/or the location of the detected movement. For example, the notice may indicate that a door has moved 30 cm. The timer may be reset 640 once the notice is generated at 635. In some configurations, a user may, upon receiving the generated notice provide an instruction to the system at 645. The provided instruction, for example, may initiate a silent alarm that may continue to observe the home and alert law enforcement, but it may not otherwise provide an indication to a would be intruder that the intrusion has been detected. As another example, the provided instruction may activate an interior security camera.

While the system is in the away mode 601, it may determine whether there has been an intrusion or other abnormality with the smart home at 610. For example, a motion camera in a room in which the magnetometer and/or magnet are located may detect movement therein at 610. In the event such an intrusion and/or movement is detected, the system may sample the magnetometer at 620 and proceed as described above.

In some configurations, the system may determine at 630 if the door has moved beyond a threshold distance. For example, the magnetometer may sample the magnetic fields proximal to it at 620. If the magnetic field strength is above a threshold level of field strength, the system may not generate a notice at 635. For example, a door connected to its frame by a hinge mechanism may move slightly in a breeze. The movement may be detected, but it may not be enough movement for the system to generate an alarm. As shown in FIG. 4 for example, the magnetic field strength may still be in the range indicated by 420. If, however, the movement is sufficient to place the system in the range indicated by 430, then a notice may be generated at 635. Thus, movement of the moveable partition at 630 may be based on the measurement of the magnetic field strength.

Figure 7:
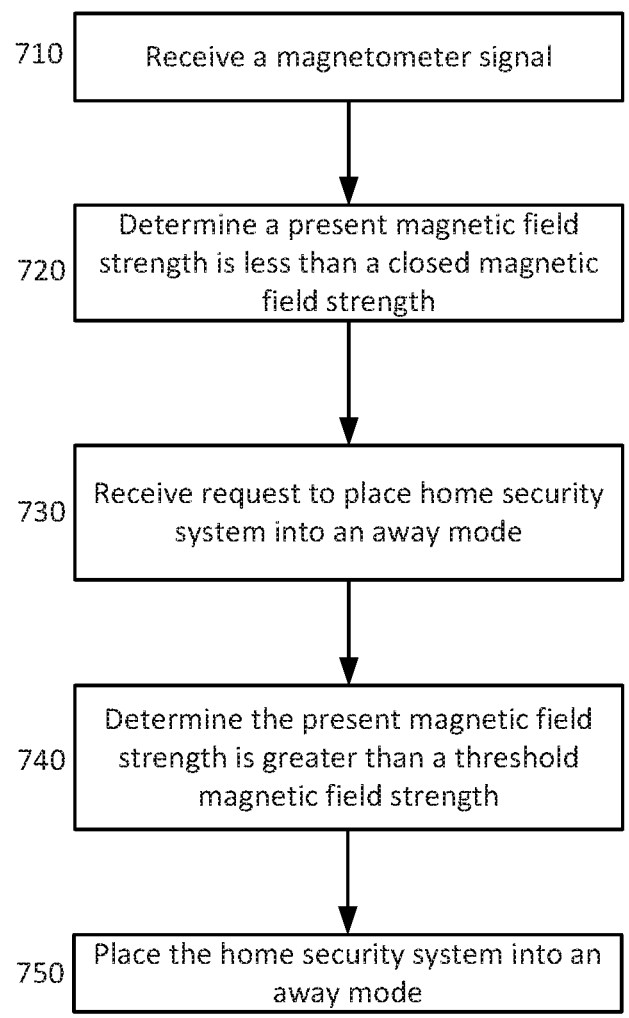
FIG. 7 is an example of a process to determine whether a home may be placed into an away state based on a magnetic field strength as disclosed herein.

FIG. 7 is an example of a process to determine whether a home may be placed into an away state based on a magnetic field strength as disclosed herein. At 710, a magnetometer signal may be received as described above. A present magnetic field strength may be determined, based on the received magnetic field strength, to be less than a closed magnetic field strength at 720. A closed magnetic field strength may refer to the magnetic field strength sensed by the magnetometer when the moveable partition is closed or a semi-open position. For example, the closed or semi open position may refer to 410 and 420 of FIG. 4. The present magnetic field strength may fall within the range indicated by 430. A request to place a smart home or home security system into an away mode may be received at 730 as described herein. For example, a user may close a door that was open to a semi-open distance. The present magnetic field may be ascertained by the magnetometer (e.g., a second magnetometer signal may be received) and determined to be greater than a threshold magnetic field strength at 740. The threshold magnetic field may refer to, for example, a magnetic field strength represented by 410 and 420. The threshold may be adjusted depending on the application and/or an individual hardware manufacturer's specification or design. Based on the determination that the present magnetic field strength is greater than the threshold magnetic field strength and responsive to the request, the home security system may be placed into an away mode at 750. Placement into an away mode may refer to activating one or more sensors configured to detect intrusion into the home and/or abnormalities with the home (e.g., fire, smoke, carbon monoxide, etc.).

In an implementation, a system is disclosed that includes a magnet fixed to a moveable partition that is surrounded by an enclosure (see FIGS. 1D-1F for example) and a processor. The processor may be configured to receive a magnetometer signal and determine that a magnetic field strength, based on the magnetometer signal, is more than a magnetic field strength when the moveable partition is substantially closed as described above. The processor may receive a request to place the home security system into an away mode as described earlier. The processor may determine that the magnetic field strength is above a threshold level and, responsive to the request and based on based on the determination, place the home security system into the away mode.

Figure 8:
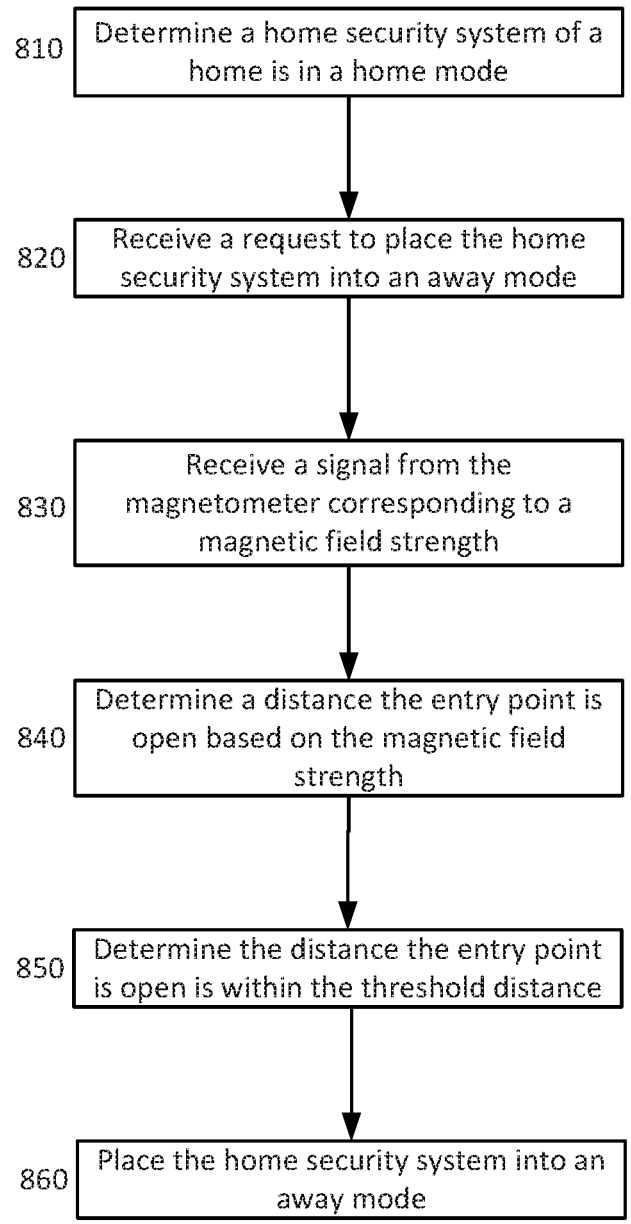
FIG. 8 is an example process for determining that a home security system can be placed into an away mode while an entry point of a home is within a threshold distance closed as disclosed herein.

FIG. 8 is an example process for determining that a home security system can be placed into an away mode while an entry point of a home is within a threshold distance closed. At 810, a home security system of a home may be determined to be in a home mode. A home mode may allow movement through an entry point of the home. The home security system may include a magnetometer and a magnet associated with the entry point of the home. An entry point may refer to a location of ingress or egress for a human or an animal into a home such as a door, a window, a pet door, and a garage door. The entry point may include an enclosure and a moveable partition as described earlier. The magnetometer, such as a compass, may be configured to detect a magnetic field of the magnet when the magnetometer is within a threshold distance from the magnet as described above.

At 820, a request to place the home security system into an away mode may be received. The away mode may detect an intrusion into the entry point of the home and define a response to the intrusion. The response may be an alarm, a notice to law enforcement and/or a client device, etc. A signal from the magnetometer may be received at 830 that indicates a magnetic field strength.

A distance that an entry point is open may be determined based on the magnetic field strength detected by the magnetometer at 840. The distance determined may be in relative terms such as open, semi-open, or closed as shown in FIG. 3. For example, it may be determined that the magnetic field strength falls into the range shown in FIG. 4 represented by 420. It may be determined that the distance the entry point is open is semi-open. In some configurations, a physical distance may be approximated or computed based on the magnetic field strength. The distance that the entry point is open may be determined to be within the threshold distance at 850 as describe above. Based on the determination at 850 and responsive to the received request at 820, the home security system may be placed into the away mode at 860. A response may be generated once the system is placed into the away mode. The response may be sent to a controller, a client device, and/or a remote device as described earlier.

If movement of the moveable partition at the entry point is detected, the system may determine that the distance the entry point is open is not within the threshold distance. It may dispatch an alarm such as a visual cue, an audio cue, a notice to a client device and/or law enforcement, and/or a notice to the controller.

In some configurations, a presence of a second magnetic field may be detected. For example, a user may place a second magnet near the top of a window enclosure such that when the window is open, the magnetometer is brought in proximity to the magnet. The second magnetic field may be detected by the strength of the magnetic field and/or the magnetic field strength profile. The profile, for example, may indicate a strong field when the window is in the closed position and the second field providing an indication of the second magnetic field. The profile may observe the magnetic field strength for the entire range of movement for the moveable partition (e.g., from closed to open). The profile may be established during the initial set-up of the magnetometer and magnet and may be stored to computer readable medium of the controller and/or a remote system. The profile may be used as a basis of comparison at a subsequent time.

In an implementation, a system is provided that may include a magnetometer, a magnet, and a processor. The magnetometer and magnet may be associated an entry point of a home as described above. The processor may be configured to determine the system of a home is in a home mode as described above. The processor may receive a request to place the system into an away mode. It may receive a signal from the magnetometer indicating a magnetic field strength and determine a distance the entry point is open based on the magnetic field strength detected by the magnetometer as described earlier. The processor may be configured to determine that the distance that the entry point is open is within the threshold distance. It may place the home security system into the away mode based on the determined distance and responsive to the request.

As described above, a smart home environment or home security system may operate in at least two modes, a home mode and an away mode. A user may elect to place the system into the away mode (e.g., armed) despite a moveable partition such as a window being open or semi-open. After being placed in the away state, the system may detect that the moveable partition has been moved from an open to semi-open or closed state or from a semi-open to closed state. As an example, a user may exit a home and request the system to be placed into an away state. The system may generate a notice that is provided to the user that indicates a back door is open. The user may elect to place the system into the away state. Subsequent to the system being placed in the away state, the user may place the door in a semi-open or closed state from the outside of the home. The system may generate a notice that indicates to the user that the moveable partition has been moved into a semi-open or closed position, respectively.

In some configurations, a smart home environment may be occupied by users (e.g., authorized occupants of the home). The system may detect that a window to a bedroom has been placed in an open position or a semi-open position. The system's response to the open window may be based on the time of day and type of day (e.g., holiday, weekday, weekend) and/or other learned behavior (e.g., occupancy, past behavior of occupants, etc.). During the daytime of the weekend, the system may be configured to ignore movement of a moveable partition while the home is occupied (e.g., in a home mode). At night, the system may have previously observed, for example, a window being placed in an open or semi-open position between the hours of 10:00 PM and 12:00 AM in a first bedroom and 8:00 PM and 8:30 PM of a second bedroom. Movement of a window to the open or semi-open position during these time-periods may be ignored by the system based on the learned behavior. In some instances, if the moveable partition is in the open state, the system may notify the user of the potential security threat (e.g., the open state of a window in bedroom 1) shortly after the moveable partition is placed in the open position. In some instances, the system may determine, in addition to the timing of the observed behavior, if the opening of the moveable partition occurred from the inside or outside of the house. For example, motion sensors located in and outside the home may indicate motion originating from the interior of the home coincident with the timing of the window being opened. If, however, the system detects movement of the window outside of the learned times, it may generate a notice for an authorized occupant. For example, if a window to bedroom 1 is placed in a semi-open position at 12:45 AM, the system may determine that this is an atypical behavior for this particular window and alert a client device belonging to an authorized user.

In some implementations, a magnetometer such as a compass may provide an indication of orientation of a hinged door (see, for example, FIGS. 10A and 10B) relative to a geomagnetic field. The orientation may be utilized to determine whether the door is in an open, semi-open, or closed state. The magnetometer may be calibrated to determine orientation in a closed position. The system may determine that a semi-open position of the door may refer to the door being moved five degrees or less relative to the closed position. Beyond five degrees, the door may be deemed open. Thus, the presence of a magnet is not necessary to ascertain a state of the door. In the event a magnet is placed near the door, the magnet may provide a stronger magnetic field than the geomagnetic field. The system may indicate the presence of the magnet to an authorized occupant.

Implementations disclosed herein may use one or more sensors. In general, a "sensor" may refer to any device that can obtain information about its environment. Sensors may be described by the type of information they collect. For example, sensor types as disclosed herein may include motion, smoke, carbon monoxide, proximity, temperature, time, physical orientation, acceleration, location, entry, presence, pressure, light, sound, and the like. A sensor also may be described in terms of the particular physical device that obtains the environmental information. For example, an accelerometer may obtain acceleration information, and thus may be used as a general motion sensor and/or an acceleration sensor. A sensor also may be described in terms of the specific hardware components used to implement the sensor. For example, a temperature sensor may include a thermistor, thermocouple, resistance temperature detector, integrated circuit temperature detector, or combinations thereof. A sensor also may be described in terms of a function or functions the sensor performs within an integrated sensor network, such as a smart home environment as disclosed herein. For example, a sensor may operate as a security sensor when it is used to determine security events such as unauthorized entry. A sensor may operate with different functions at different times, such as where a motion sensor is used to control lighting in a smart home environment when an authorized user is present, and is used to alert to unauthorized or unexpected movement when no authorized user is present, or when an alarm system is in an "armed" state, or the like. In some cases, a sensor may operate as multiple sensor types sequentially or concurrently, such as where a temperature sensor is used to detect a change in temperature, as well as the presence of a person or animal. A sensor also may operate in different modes at the same or different times. For example, a sensor may be configured to operate in one mode during the day and another mode at night. As another example, a sensor may operate in different modes based upon a state of a home security system or a smart home environment, or as otherwise directed by such a system.

In general, a "sensor" as disclosed herein may include multiple sensors or sub-sensors, such as where a position sensor includes both a global positioning sensor (GPS) as well as a wireless network sensor, which provides data that can be correlated with known wireless networks to obtain location information. Multiple sensors may be arranged in a single physical housing, such as where a single device includes movement, temperature, magnetic, and/or other sensors. Such a housing also may be referred to as a sensor, a sensor device, or a sensor package. For clarity, sensors are described with respect to the particular functions they perform and/or the particular physical hardware used, when such specification is necessary for understanding of the implementations disclosed herein.

Figure 9A:
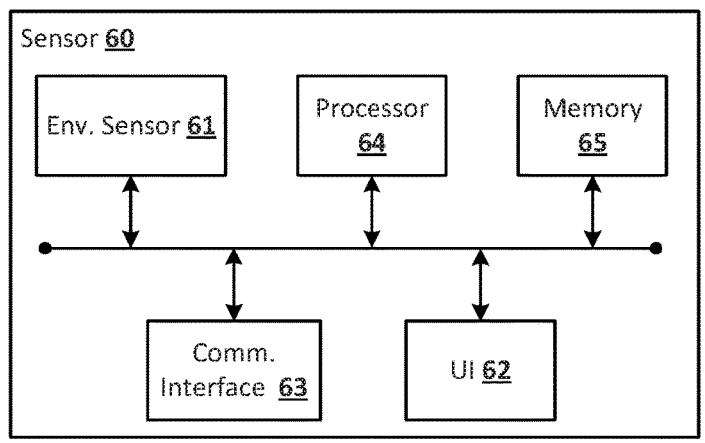
FIG. 9A shows an example sensor as disclosed herein.

A sensor may include hardware in addition to the specific physical sensor that obtains information about the environment. FIG. 9A shows an example sensor as disclosed herein. The sensor 60 may include an environmental sensor 61, such as a temperature sensor, smoke sensor, carbon monoxide sensor, motion sensor, accelerometer, proximity sensor, passive infrared (PIR) sensor, magnetic field sensor, radio frequency (RF) sensor, light sensor, humidity sensor, pressure sensor, microphone, or any other suitable environmental sensor, that obtains a corresponding type of information about the environment in which the sensor 60 is located. A processor 64 may receive and analyze data obtained by the sensor 61, control operation of other components of the sensor 60, and process communication between the sensor and other devices. The processor 64 may execute instructions stored on a computer-readable memory 65. The memory 65 or another memory in the sensor 60 may also store environmental data obtained by the sensor 61. A communication interface 63, such as a Wi-Fi or other wireless interface, Ethernet or other local network interface, or the like may allow for communication by the sensor 60 with other devices. A user interface (UI) 62 may provide information and/or receive input from a user of the sensor. The UI 62 may include, for example, a speaker to output an audible alarm when an event is detected by the sensor 60. Alternatively, or in addition, the UI 62 may include a light to be activated when an event is detected by the sensor 60. The user interface may be relatively minimal, such as a liquid crystal display (LCD), light-emitting diode (LED) display, or limited-output display, or it may be a full-featured interface such as a touchscreen. Components within the sensor 60 may transmit and receive information to and from one another via an internal bus or other mechanism as will be readily understood by one of skill in the art. One or more components may be implemented in a single physical arrangement, such as where multiple components are implemented on a single integrated circuit. Sensors as disclosed herein may include other components, and/or may not include all of the illustrative components shown.

In some configurations, two or more sensors may generate data that can be used by a processor of a system to generate a response and/or infer a state of the environment. For example, an ambient light sensor in a room may determine that the room is dark (e.g., less than 60 lux). A microphone in the room may detect a sound above a set threshold, such as 60 dB. The system processor may determine, based on the data generated by both sensors that it should activate one or more lights in the room. In the event the processor only received data from the ambient light sensor, the system may not have any basis to alter the state of the lighting in the room. Similarly, if the processor only received data from the microphone, the system may lack sufficient data to determine whether activating the lights in the room is necessary, for example, during the day the room may already be bright or during the night the lights may already be on. As another example, two or more sensors may communicate with one another. Thus, data generated by multiple sensors simultaneously or nearly simultaneously may be used to determine a state of an environment and, based on the determined state, generate a response.

Figure 10A:
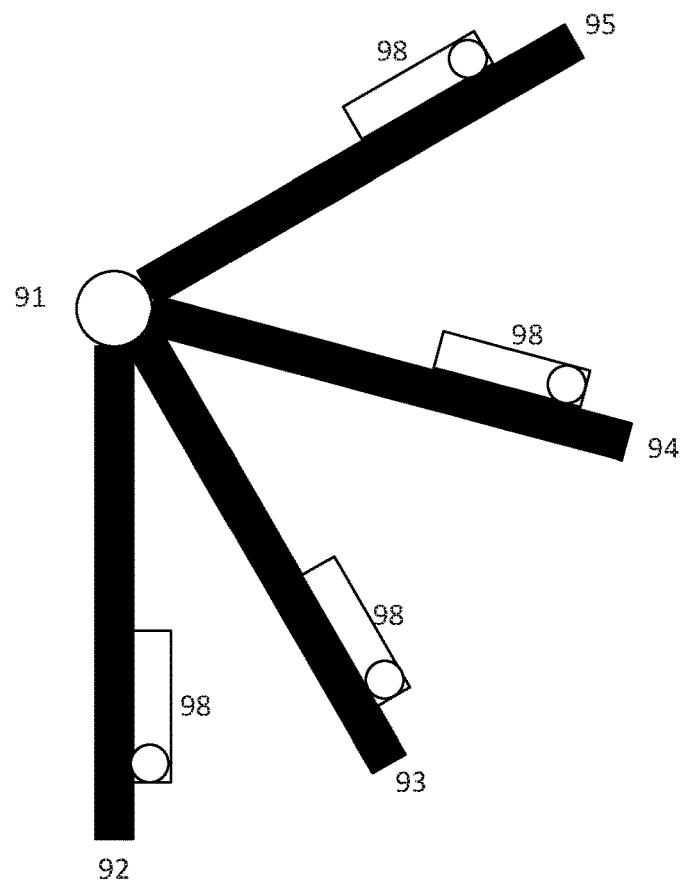
FIG. 10A shows a schematic representation of an example of a door that opens by a hinge mechanism as disclosed herein.

As another example, a security system may employ a magnetometer affixed to a doorjamb and a magnet affixed to the door. When the door is closed, the magnetometer may detect the magnetic field emanating from the magnet. If the door is opened, the increased distance may cause the magnetic field near the magnetometer to be too weak to be detected by the magnetometer. If the security system is activated, it may interpret such non-detection as the door being ajar or open. In some configurations, a separate sensor or a sensor integrated into one or more of the magnetometer and/or magnet may be incorporated to provide data regarding the status of the door. For example, an accelerometer and/or a compass may be affixed to the door and indicate the status of the door and/or augment the data provided by the magnetometer. FIG. 10A shows a schematic representation of an example of a door that opens by a hinge mechanism 91. In the first position 92, the door is closed and the compass 98 may indicate a first direction. The door may be opened at a variety of positions as shown 93, 94, 95. The fourth position 95 may represent the maximum amount the door can be opened. Based on the compass 98 readings, the position of the door may be determined and/or distinguished more specifically than merely open or closed. In the second position 93, for example, the door may not be far enough apart for a person to enter the home. A compass or similar sensor may be used in conjunction with a magnet, such as to more precisely determine a distance from the magnet, or it may be used alone and provide environmental information based on the ambient magnetic field, as with a conventional compass.

Figure 10B:
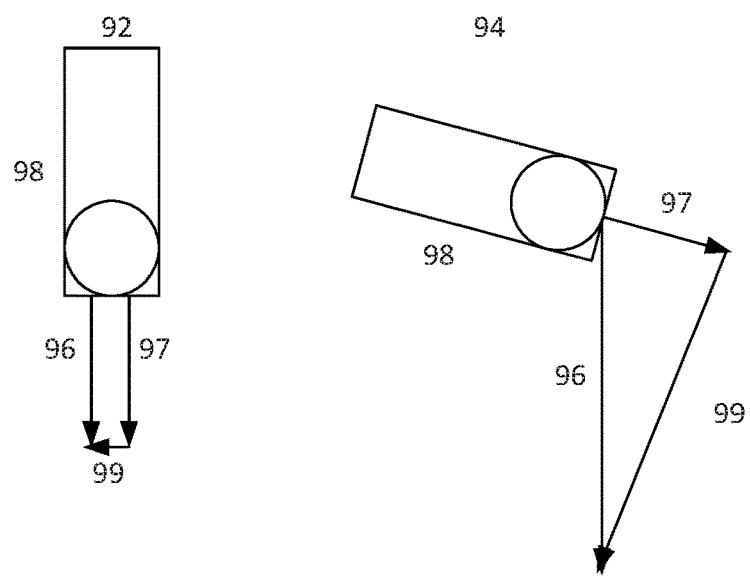
FIG. 10B shows a compass in two different positions that are illustrated in FIG. 8A, according to implementations disclosed herein.

FIG. 10B shows a compass 98 in two different positions, 92, 94, from FIG. 10A. In the first position 92, the compass detects a first direction 96. The compass's direction is indicated as 97 and it may be a known distance from a particular location. For example, when affixed to a door, the compass may automatically determine the distance from the doorjamb or a user may input a distance from the doorjamb. The distance representing how far away from the doorjamb the door is 99 may be computed by a variety of trigonometric formulas. In the first position 92, the door is indicated as not being separate from the doorjamb (i.e., closed) 99. Although features 96 and 97 are shown as distinct in FIG. 10B, they may overlap entirely. In the second position 94, the distance between the doorjamb and the door 99 may indicate that the door has been opened wide enough that a person may enter. Thus, the sensors may be integrated into a home security system, mesh network, or work in combination with other sensors positioned in and/or around an environment.

In some configurations, an accelerometer may be employed to indicate how quickly the door is moving. For example, the door may be lightly moving due to a breeze. This may be contrasted with a rapid movement due to a person swinging the door open. The data generated by the compass, accelerometer, and/or magnetometer may be analyzed and/or provided to a central system such as a controller 73 and/or remote system 74 as previously described. The data may be analyzed to learn a user behavior, an environment state, and/or as a component of a home security or home automation system. While the above example is described in the context of a door, a person having ordinary skill in the art will appreciate the applicability of the disclosed subject matter to other implementations such as a window, garage door, fireplace doors, vehicle windows/doors, faucet positions (e.g., an outdoor spigot), a gate, seating position, etc.

Data generated by one or more sensors may indicate a behavior pattern of one or more users and/or an environment state over time, and thus may be used to "learn" such characteristics. For example, data generated by an ambient light sensor in a room of a house and the time of day may be stored in a local or remote storage medium with the permission of an end user. A processor in communication with the storage medium may compute a behavior based on the data generated by the light sensor. The light sensor data may indicate that the amount of light detected increases until an approximate time or time period, such as 3:30 PM, and then declines until another approximate time or time period, such as 5:30 PM, at which point there is an abrupt increase in the amount of light detected. In many cases, the amount of light detected after the second time period may be either below a dark level of light (e.g., under or equal to 60 lx) or bright (e.g., equal to or above 400 lx). In this example, the data may indicate that after 5:30 PM, an occupant is turning on/off a light as the occupant of the room in which the sensor is located enters/leaves the room. At other times, the light sensor data may indicate that no lights are turned on/off in the room. The system, therefore, may learn that occupants patterns of turning on and off lights, and may generate a response to the learned behavior. For example, at 5:30 PM, a smart home environment or other sensor network may automatically activate the lights in the room if it detects an occupant in proximity to the home. In some implementations, such behavior patterns may be verified using other sensors. Continuing the example, user behavior regarding specific lights may be verified and/or further refined based upon states of, or data gathered by, smart switches, outlets, lamps, and the like.

Sensors as disclosed herein may operate within a communication network, such as a conventional wireless network, and/or a sensor-specific network through which sensors may communicate with one another and/or with dedicated other devices. In some configurations, one or more sensors may provide information to one or more other sensors, to a central controller, or to any other device capable of communicating on a network with the one or more sensors. A central controller may be general- or special-purpose. For example, one type of central controller is a home automation network that collects and analyzes data from one or more sensors within the home. Another example of a central controller is a special-purpose controller that is dedicated to a subset of functions, such as a security controller that collects and analyzes sensor data primarily or exclusively as it relates to various security considerations for a location. A central controller may be located locally with respect to the sensors with which it communicates and from which it obtains sensor data, such as in the case where it is positioned within a home that includes a home automation and/or sensor network. Alternatively or in addition, a central controller as disclosed herein may be remote from the sensors, such as where the central controller is implemented as a cloud-based system that communicates with multiple sensors, which may be located at multiple locations and may be local or remote with respect to one another.

Figure 9B:
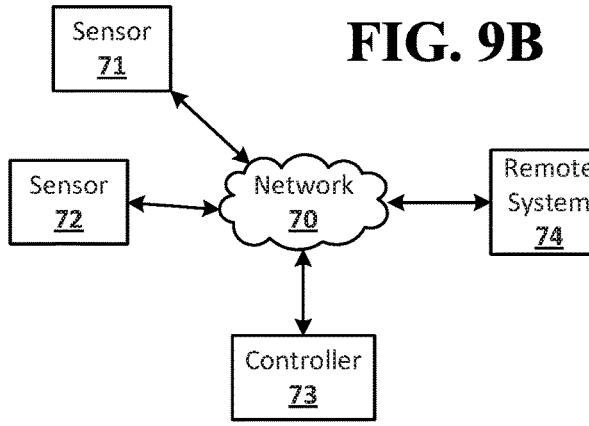
FIG. 9B shows an example of a sensor network as disclosed herein.

FIG. 9B shows an example of a sensor network as disclosed herein, which may be implemented over any suitable wired and/or wireless communication networks. One or more sensors 71, 72 may communicate via a local network 70, such as a Wi-Fi or other suitable network, with each other and/or with a controller 73. The controller may be a general- or special-purpose computer such as a smartphone, a smartwatch, a tablet, a laptop, etc. The controller may, for example, receive, aggregate, and/or analyze environmental information received from the sensors 71, 72. The sensors 71, 72 and the controller 73 may be located locally to one another, such as within a single dwelling, office space, building, room, or the like, or they may be remote from each other, such as where the controller 73 is implemented in a remote system 74 such as a cloud-based reporting and/or analysis system. In some configurations, the system may have multiple controllers 74 such as where multiple occupants' smartphones and/or smartwatches are authorized to control and/or send/receive data to or from the various sensors 71, 72 deployed in the home. Alternatively or in addition, sensors may communicate directly with a remote system 74. The remote system 74 may, for example, aggregate data from multiple locations, provide instruction, software updates, and/or aggregated data to a controller 73 and/or sensors 71, 72.

The devices of the security system and smart-home environment of the disclosed subject matter may be communicatively connected via the network 70, which may be a mesh-type network such as Thread, which provides network architecture and/or protocols for devices to communicate with one another. Typical home networks may have a single device point of communications. Such networks may be prone to failure, such that devices of the network cannot communicate with one another when the single device point does not operate normally. The mesh-type network of Thread, which may be used in the security system of the disclosed subject matter, may avoid communication using a single device. That is, in the mesh-type network, such as network 70, there is no single point of communication that may fail and prohibit devices coupled to the network from communicating with one another.

The communication and network protocols used by the devices communicatively coupled to the network 70 may provide secure communications, minimize the amount of power used (i.e., be power efficient), and support a wide variety of devices and/or products in a home, such as appliances, access control, climate control, energy management, lighting, safety, and security. For example, the protocols supported by the network and the devices connected thereto may have an open protocol that may carry IPv6 natively.

The Thread network, such as network 70, may be easy to set up and secure to use. The network 70 may use an authentication scheme, AES (Advanced Encryption Standard) encryption, or the like to reduce and/or minimize security holes that exist in other wireless protocols. The Thread network may be scalable to connect devices (e.g., 2, 5, 10, 20, 50, 100, 150, 200, or more devices) into a single network supporting multiple hops (e.g., to provide communications between devices when one or more nodes of the network is not operating normally). The network 70, which may be a Thread network, may provide security at the network and application layers. One or more devices communicatively coupled to the network 70 (e.g., controller 73, remote system 74, and the like) may store product install codes to ensure only authorized devices can join the network 70. One or more operations and communications of network 70 may use cryptography, such as public-key cryptography.

The devices communicatively coupled to the network 70 of the smart-home environment and/or security system disclosed herein may low power consumption and/or reduced power consumption. That is, devices efficiently communicate to with one another and operate to provide functionality to the user, where the devices may have reduced battery size and increased battery lifetimes over conventional devices. The devices may include sleep modes to increase battery life and reduce power requirements. For example, communications between devices coupled to the network 70 may use the power-efficient IEEE 802.15.4 MAC/PHY protocol. In embodiments of the disclosed subject matter, short messaging between devices on the network 70 may conserve bandwidth and power. The routing protocol of the network 70 may reduce network overhead and latency. The communication interfaces of the devices coupled to the smart-home environment may include wireless system-on-chips to support the low-power, secure, stable, and/or scalable communications network 70.

The sensor network shown in FIG. 9B may be an example of a smart-home environment. The depicted smart-home environment may include a structure, a house, office building, garage, mobile home, or the like. The devices of the smart home environment, such as the sensors 71, 72, the controller 73, and the network 70 may be integrated into a smart-home environment that does not include an entire structure, such as an apartment, condominium, or office space.

The smart home environment can control and/or be coupled to devices outside of the structure. For example, one or more of the sensors 71, 72 may be located outside the structure, for example, at one or more distances from the structure (e.g., sensors 71, 72 may be disposed outside the structure, at points along a land perimeter on which the structure is located, and the like. One or more of the devices in the smart home environment need not physically be within the structure. For example, the controller 73 which may receive input from the sensors 71, 72 may be located outside of the structure.

The structure of the smart-home environment may include a plurality of rooms, separated at least partly from each other via walls. The walls can include interior walls or exterior walls. Each room can further include a floor and a ceiling. Devices of the smart-home environment, such as the sensors 71, 72, may be mounted on, integrated with and/or supported by a wall, floor, or ceiling of the structure.

The smart-home environment including the sensor network shown in FIG. 9B may include a plurality of devices, including intelligent, multi-sensing, network-connected devices, that can integrate seamlessly with each other and/or with a central server or a cloud-computing system (e.g., controller 73 and/or remote system 74) to provide home-security and smart-home features. The smart-home environment may include one or more intelligent, multi-sensing, network-connected thermostats (e.g., "smart thermostats"), one or more intelligent, network-connected, multi-sensing hazard detection units (e.g., "smart hazard detectors"), and one or more intelligent, multi-sensing, network-connected entryway interface devices (e.g., "smart doorbells"). The smart hazard detectors, smart thermostats, and smart doorbells may be the sensors 71, 72 shown in FIG. 9B.

For example, a smart thermostat may detect ambient climate characteristics (e.g., temperature and/or humidity) and may control an HVAC (heating, ventilating, and air conditioning) system accordingly of the structure. For example, the ambient client characteristics may be detected by sensors 71, 72 shown in FIG. 9B, and the controller 73 may control the HVAC system (not shown) of the structure.

As another example, a smart hazard detector may detect the presence of a hazardous substance or a substance indicative of a hazardous substance (e.g., smoke, fire, or carbon monoxide). For example, smoke, fire, and/or carbon monoxide may be detected by sensors 71, 72 shown in FIG. 9B, and the controller 73 may control an alarm system to provide a visual and/or audible alarm to the user of the smart-home environment.

As another example, a smart doorbell may control doorbell functionality, detect a person's approach to or departure from a location (e.g., an outer door to the structure), and announce a person's approach or departure from the structure via audible and/or visual message that is output by a speaker and/or a display coupled to, for example, the controller 73.

In some implementations, the smart-home environment of the sensor network shown in FIG. 9B may include one or more intelligent, multi-sensing, network-connected wall switches (e.g., "smart wall switches"), one or more intelligent, multi-sensing, network-connected wall plug interfaces (e.g., "smart wall plugs"). The smart wall switches and/or smart wall plugs may be or include one or more of the sensors 71, 72 shown in FIG. 9B. A smart wall switch may detect ambient lighting conditions, and control a power and/or dim state of one or more lights. For example, a sensor such as sensors 71, 72, may detect ambient lighting conditions, and a device such as the controller 73 may control the power to one or more lights (not shown) in the smart-home environment. Smart wall switches may also control a power state or speed of a fan, such as a ceiling fan. For example, sensors 72, 72 may detect the power and/or speed of a fan, and the controller 73 may adjust the power and/or speed of the fan, accordingly. Smart wall plugs may control supply of power to one or more wall plugs (e.g., such that power is not supplied to the plug if nobody is detected to be within the smart-home environment). For example, one of the smart wall plugs may control supply of power to a lamp (not shown).

In implementations of the disclosed subject matter, a smart-home environment may include one or more intelligent, multi-sensing, network-connected entry detectors (e.g., "smart entry detectors"). Such detectors may be or include one or more of the sensors 71, 72 shown in FIG. 9B. The illustrated smart entry detectors (e.g., sensors 71, 72) may be disposed at one or more windows, doors, and other entry points of the smart-home environment for detecting when a window, door, or other entry point is opened, broken, breached, and/or compromised. The smart entry detectors may generate a corresponding signal to be provided to the controller 73 and/or the remote system 74 when a window or door is opened, closed, breached, and/or compromised. In some implementations of the disclosed subject matter, the alarm system, which may be included with controller 73 and/or coupled to the network 70 may not arm unless all smart entry detectors (e.g., sensors 71, 72) indicate that all doors, windows, entryways, and the like are closed and/or that all smart entry detectors are armed. In some configurations, such as the door example shown in FIGS. 10A and 10B, the system may arm if it can be determined that the distance the door (or window) is ajar is insubstantial (e.g., the opening is not wide enough for a person to fit through).

The smart-home environment of the sensor network shown in FIG. 9B can include one or more intelligent, multi-sensing, network-connected doorknobs (e.g., "smart doorknob"). For example, the sensors 71, 72 may be coupled to a doorknob of a door (e.g., doorknobs 122 located on external doors of the structure of the smart-home environment). However, it should be appreciated that smart doorknobs can be provided on external and/or internal doors of the smart-home environment.

The smart thermostats, the smart hazard detectors, the smart doorbells, the smart wall switches, the smart wall plugs, the smart entry detectors, the smart doorknobs, the keypads, and other devices of a smart-home environment (e.g., as illustrated as sensors 71, 72 of FIG. 9B) can be communicatively coupled to each other via the network 70, and to the controller 73 and/or remote system 74 to provide security, safety, and/or comfort for the smart home environment.

A user can interact with one or more of the network-connected smart devices (e.g., via the network 70). For example, a user can communicate with one or more of the network-connected smart devices using a computer (e.g., a desktop computer, laptop computer, tablet, or the like) or other portable electronic device (e.g., a smartphone, a tablet, a key FOB, or the like). A webpage or application can be configured to receive communications from the user and control the one or more of the network-connected smart devices based on the communications and/or to present information about the device's operation to the user. For example, the user can view, arm or disarm the security system of the home.

One or more users can control one or more of the network-connected smart devices in the smart-home environment using a network-connected computer or portable electronic device. In some examples, some or all of the users (e.g., individuals who live in the home) can register their mobile device and/or key FOBs with the smart-home environment (e.g., with the controller 73). Such registration can be made at a central server (e.g., the controller 73 and/or the remote system 74) to authenticate the user and/or the electronic device as being associated with the smart-home environment, and to provide permission to the user to use the electronic device to control the network-connected smart devices and the security system of the smart-home environment. A user can use their registered electronic device to remotely control the network-connected smart devices and security system of the smart-home environment, such as when the occupant is at work or on vacation. The user may also use their registered electronic device to control the network-connected smart devices when the user is located inside the smart-home environment.

Alternatively, or in addition to registering electronic devices, the smart-home environment may make inferences about which individuals live in the home and are therefore users and which electronic devices are associated with those individuals. As such, the smart-home environment may "learn" who is a user (e.g., an authorized user) and permit the electronic devices associated with those individuals to control the network-connected smart devices of the smart-home environment (e.g., devices communicatively coupled to the network 70), in some implementations including sensors used by or within the smart-home environment. Various types of notices and other information may be provided to users via messages sent to one or more user electronic devices. For example, the messages can be sent via email, short message service (SMS), multimedia messaging service (MMS), unstructured supplementary service data (USSD), as well as any other type of messaging services and/or communication protocols.

A smart-home environment may include communication with devices outside of the smart-home environment but within a proximate geographical range of the home. For example, the smart-home environment may include an outdoor lighting system (not shown) that communicates information through the communication network 70 or directly to a central server or cloud-computing system (e.g., controller 73 and/or remote system 74) regarding detected movement and/or presence of people, animals, and any other objects and receives back commands for controlling the lighting accordingly.

The controller 73 and/or remote system 74 can control the outdoor lighting system based on information received from the other network-connected smart devices in the smart-home environment. For example, in the event that any of the network-connected smart devices, such as smart wall plugs located outdoors, detect movement at nighttime, the controller 73 and/or remote system 74 can activate the outdoor lighting system and/or other lights in the smart-home environment.

Figure 9C:
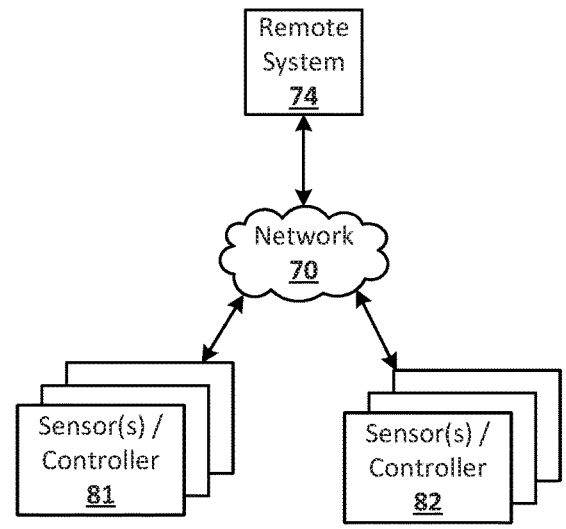
FIG. 9C shows an example configuration of sensors, one or more controllers, and a remote system as disclosed herein.

In some configurations, a remote system 74 may aggregate data from multiple locations, such as multiple buildings, multi-resident buildings, and individual residences within a neighborhood, multiple neighborhoods, and the like. In general, multiple sensor/controller systems 81, 82 as previously described with respect to FIG. 9B may provide information to the remote system 74 as shown in FIG. 9C. The systems 81, 82 may provide data directly from one or more sensors as previously described, or the data may be aggregated and/or analyzed by local controllers such as the controller 73, which then communicates with the remote system 74. The remote system may aggregate and analyze the data from multiple locations, and may provide aggregate results to each location. For example, the remote system 74 may examine larger regions for common sensor data or trends in sensor data, and provide information on the identified commonality or environmental data trends to each local system 81, 82.

In situations in which the systems discussed here collect personal information about users, or may make use of personal information, the users may be provided with an opportunity to control whether programs or features collect user information (e.g., information about a user's social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. As another example, systems disclosed herein may allow a user to restrict the information collected by the systems disclosed herein to applications specific to the user, such as by disabling or limiting the extent to which such information is aggregated or used in analysis with other information from other users. Thus, the user may have control over how information is collected about the user and used by a system as disclosed herein.

Figure 11A:
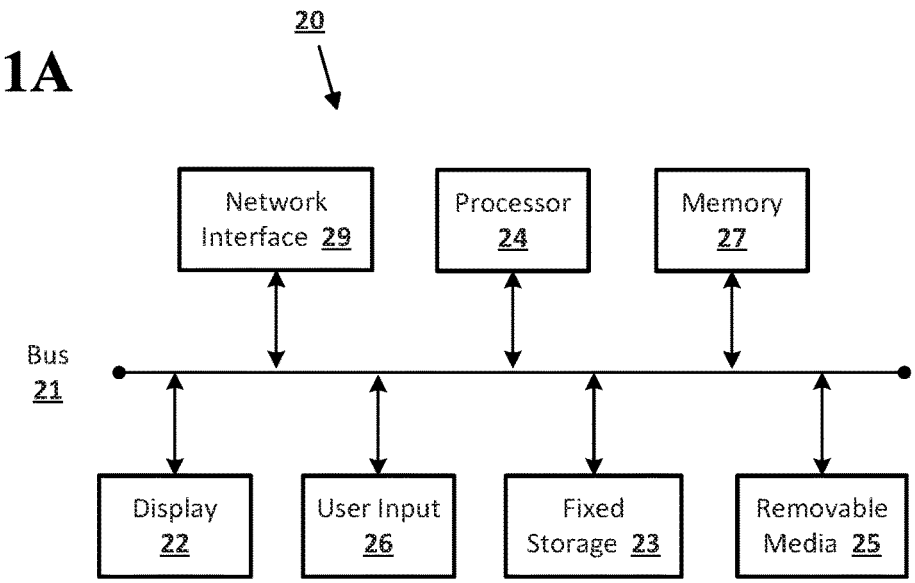
FIG. 11A shows a computer according to an implementation of the disclosed subject matter.

Implementations of the presently disclosed subject matter may be implemented in and used with a variety of component and network architectures. FIG. 11A is an example computer 20 suitable for implementations of the presently disclosed subject matter. The computer 20 includes a bus 21 which interconnects major components of the computer 20, such as a central processor 24, a memory 27 (typically RAM, but which may also include ROM, flash RAM, or the like), an input/output controller 28, a user display 22, such as a display screen via a display adapter, a user input interface 26, which may include one or more controllers and associated user input devices such as a keyboard, mouse, and the like, and may be closely coupled to the I/O controller 28, fixed storage 23, such as a hard drive, flash storage, Fibre Channel network, SAN device, SCSI device, and the like, and a removable media component 25 operative to control and receive an optical disk, flash drive, and the like.

The bus 21 allows data communication between the central processor 24 and the memory 27, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) that controls basic hardware operation such as the interaction with peripheral components. Applications resident with the computer 20 are generally stored on and accessed via a computer readable medium, such as a hard disk drive (e.g., fixed storage 23), an optical drive, floppy disk, or other storage medium 25.

The fixed storage 23 may be integral with the computer 20 or may be separate and accessed through other interfaces. A network interface 29 may provide a direct connection to a remote server via a telephone link, to the Internet via an Internet service provider (ISP), or a direct connection to a remote server via a direct network link to the Internet via a POP (point of presence) or other technique. The network interface 29 may provide such connection using wireless techniques, including digital cellular telephone connection, Cellular Digital Packet Data (CDPD) connection, digital satellite data connection, or the like. For example, the network interface 29 may allow the computer to communicate with other computers via one or more local, wide-area, or other networks, as shown in FIG. 11B.

Many other devices or components (not shown) may be connected in a similar manner (e.g., document scanners, digital cameras, and so on). Conversely, all of the components shown in FIG. 11A need not be present to practice the present disclosure. The components can be interconnected in different ways from that shown. The operation of a computer such as that shown in FIG. 11A is readily known in the art and is not discussed in detail in this application. Code to implement the present disclosure can be stored in computer-readable storage media such as one or more of the memory 27, fixed storage 23, removable media 25, or on a remote storage location.

Figure 11B:
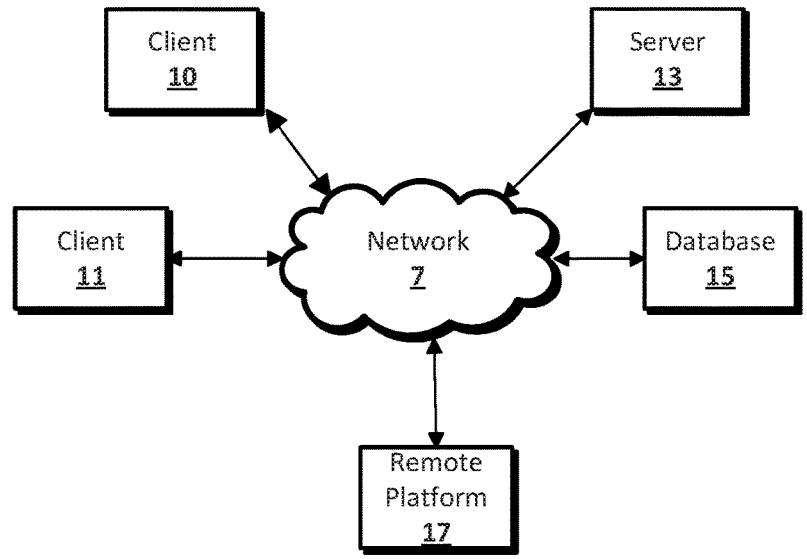
FIG. 11B shows a network configuration according to an implementation of the disclosed subject matter.

FIG. 11B shows an example network arrangement according to an implementation of the disclosed subject matter. One or more clients 10, 11, such as local computers, smart phones, tablet computing devices, and the like may connect to other devices via one or more networks 7. The network may be a local network, wide-area network, the Internet, or any other suitable communication network or networks, and may be implemented on any suitable platform including wired and/or wireless networks. The clients may communicate with one or more servers 13 and/or databases 15. The devices may be directly accessible by the clients 10, 11, or one or more other devices may provide intermediary access such as where a server 13 provides access to resources stored in a database 15. The clients 10, 11 also may access remote platforms 17 or services provided by remote platforms 17 such as cloud computing arrangements and services. The remote platform 17 may include one or more servers 13 and/or databases 15.

More generally, various implementations of the presently disclosed subject matter may include or be implemented in the form of computer-implemented processes and apparatuses for practicing those processes. The disclosed subject matter also may be implemented in the form of a computer program product having computer program code containing instructions implemented in non-transitory and/or tangible media, such as floppy diskettes, CD-ROMs, hard drives, USB (universal serial bus) drives, or any other machine readable storage medium, wherein, when the computer program code is loaded into and executed by a computer, the computer becomes an apparatus for practicing implementations of the disclosed subject matter. Implementations also may be implemented in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing implementations of the disclosed subject matter. When implemented on a general-purpose microprocessor, the computer program code segments configure the microprocessor to create specific logic circuits. In some configurations, a set of computer-readable instructions stored on a computer-readable storage medium may be implemented by a general-purpose processor, which may transform the general-purpose processor or a device containing the general-purpose processor into a special-purpose device configured to implement or carry out the instructions.

Implementations may use hardware that includes a processor, such as a general-purpose microprocessor and/or an Application Specific Integrated Circuit (ASIC) that includes all or part of the techniques according to implementations of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to implementations of the disclosed subject matter.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A system, comprising:
a first sensor affixed to a moveable partition;
one or more secondary sensors at or around the moveable partition;
a memory device; and
a processor configured to:
sample, at a first time period, a first signal from the first sensor that indicates a position of the moveable partition,
determine, based on the first signal, that the moveable partition is in an open position,
receive a request to place a home security system into an away mode,
place the home security system into the away mode based on the request to place a home security system into an away mode and subsequent to determining that the moveable partition is in an open position,
receive a second signal from the one or more secondary sensors that indicates a movement detected at or near the moveable partition that is in the open position, and generate a notice alerting a user of the movement detected at or near the moveable partition.

2. The system of claim 1, wherein the one or more secondary sensors include a motion detector.

3. The system of claim 1, wherein the one or more secondary sensors include a light sensor.

4. The system of claim 1, wherein the processor is further configured to:
store data generated by the first sensor and the one or more secondary sensors in the memory device,
determine a pattern of activity regarding the movable partition based on the data,
determine, before generating the notice, that the detected movement matches the pattern of activity, and
forgo generating the notice based on the determination that the detected movement matches the pattern of activity.

5. The system of claim 4, wherein the pattern of activity is determined based on data from at least two different sensors.

6. The system of claim 4, wherein the first sensor is a compass and the first signal further indicates an orientation of the moveable partition.

7. The system of claim 4, wherein the first sensor is an accelerometer and the first signal further indicates a speed at which the moveable partition is moving.

8. The system of claim 1, wherein the processor is further configured to generate a notice that indicates that the home security system is in the away mode and that the moveable partition is in an open position.

9. The system of claim 1, wherein the processor is further configured to:
detect that the open movable partition has moved a distance greater than a threshold distance based on a third signal from the first sensor while the home security system is in the away mode; and
generate a notice that indicates a movement of the movable partition has occurred.

10. The system of claim 1, wherein the moveable partition is a window.

11. The system of claim 1, wherein the moveable partition is a door.

12. The system of claim 1, wherein the processor is further configured to:
sample, at a second time period, the first signal from the first sensor in response to receiving the second signal,
determine, based on the first signal during the second time period, that the moveable partition has moved from the open position to a semi-open position,
wherein generating the notice is based on the determining that the moveable partition has moved from the open position to the semi-open position.

13. A computer implemented method, comprising:
sampling, at a first time period, a first signal from a first sensor that indicates a movement of a moveable partition;
determining, based on the first signal, that the moveable partition has moved less than a first threshold distance into an open position;
receiving a request to place a home security system into an away mode;
placing the home security system into the away mode based on the request to place a home security system into an away mode and subsequent to determining that the moveable partition has moved into an open position;
receiving a second signal from one or more secondary sensors that indicates a movement detected at or near the moveable partition that is in the open position; and
generating a notice alerting a user of the movement detected at or near the moveable partition.

14. The method of claim 13, wherein the one or more secondary sensors include a motion detector.

15. The method of claim 13, wherein the one or more secondary sensors include a light sensor.

16. The method of claim 13, wherein the processor is further configured to:
store data generated by the first sensor and the one or more secondary sensors in the memory device,
determine a pattern of activity regarding the movable partition based on the data,
determine, before generating the notice, that the detected movement matches the pattern of activity, and
forgo generating the notice based on the determination that the detected movement matches the pattern of activity.

17. The method of claim 16, wherein the pattern of activity is determined based on data from at least two different sensors.

18. The method of claim 16, wherein the first sensor is a compass and the first signal further indicates an orientation of the moveable partition.

19. The method of claim 16, wherein the first sensor is an accelerometer and the first signal further indicates a speed at which the moveable partition is moving.

20. The method of claim 13, wherein the processor is further configured to generate a notice that indicates that the home security system is in the away mode and that the moveable partition is in an open position.

21. The method of claim 13, wherein the processor is further configured to:
detect that the open movable partition has moved a distance greater than a threshold distance based on a third signal from the first sensor while the home security system is in the away mode; and
generate a notice that indicates a movement of the movable partition has occurred.

22. The method of claim 13, wherein the moveable partition is a window.

23. The method of claim 13, wherein the moveable partition is a door.

24. The method of claim 13, further comprising:
sampling, at a second time period, the first signal from the first sensor in response to receiving the second signal; and
determining, based on the first signal during the second time period, that the moveable partition has moved from the open position to a semi-open position,
wherein generating the notice is based on the determining that the moveable partition has moved from the open position to the semi-open position.

* * * * *